United States Patent
Murphy et al.

(10) Patent No.: US 10,734,985 B2
(45) Date of Patent: Aug. 4, 2020

(54) COMPARATORS FOR POWER AND HIGH-SPEED APPLICATIONS

(71) Applicant: QUALCOMM Incorporated, San Diego, CA (US)

(72) Inventors: Byron Murphy, San Diego, CA (US); Glenn Murphy, San Diego, CA (US); Rajeev Jain, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/375,734

(22) Filed: Apr. 4, 2019

(65) Prior Publication Data

US 2020/0195241 A1 Jun. 18, 2020

Related U.S. Application Data

(60) Provisional application No. 62/780,761, filed on Dec. 17, 2018.

(51) Int. Cl.
*H03K 5/22* (2006.01)
*H03K 5/24* (2006.01)

(52) U.S. Cl.
CPC ................. *H03K 5/2481* (2013.01)

(58) Field of Classification Search
CPC .............................. H03K 5/22; H03K 5/2481
USPC .......................................................... 327/65
See application file for complete search history.

(56) References Cited

U.S. PATENT DOCUMENTS

| | | | |
|---|---|---|---|
| 4,160,176 A | 7/1979 | Takahashi | |
| 5,434,521 A | 7/1995 | Leipold et al. | |
| 5,610,573 A | 3/1997 | Priebe | |
| 5,834,954 A | 11/1998 | Tihanyi | |
| 5,952,951 A | 9/1999 | Fujino | |
| 6,288,576 B1* | 9/2001 | Casier | H03K 5/2481 327/563 |
| 9,007,096 B1* | 4/2015 | Carey | H03F 3/45197 327/65 |
| 9,866,215 B2 | 1/2018 | Atkinson et al. | |
| 2003/0076180 A1 | 4/2003 | Murakami | |
| 2007/0096766 A1 | 5/2007 | Baba | |
| 2010/0245149 A1* | 9/2010 | Danjo | H03K 5/249 341/155 |
| 2013/0176058 A1 | 7/2013 | Iwasa | |
| 2015/0277459 A1 | 10/2015 | Iwasa | |

(Continued)

OTHER PUBLICATIONS

Furth P.M., et al., "On the Design of Low-Power CMOS Comparators with Programmable Hysteresis", IEEE, 2010, pp. 1077-1080.

(Continued)

*Primary Examiner* — Ryan Jager
(74) *Attorney, Agent, or Firm* — Qualcomm Incorporated

(57) ABSTRACT

In certain aspects, a comparator includes a first inverter having an input, an output, and a voltage supply input, wherein the input of the first inverter and the output of the first inverter are coupled together, and the voltage supply input of the first inverter is configured to receive a first compare voltage. The comparator also includes a second inverter having an input, an output, and a voltage supply input, wherein the input of the second inverter is coupled to the output of the first inverter, and the voltage supply input of the second inverter is configured to receive a second compare voltage.

17 Claims, 12 Drawing Sheets

(56) References Cited

U.S. PATENT DOCUMENTS

| | | | |
|---|---|---|---|
| 2016/0035295 A1* | 2/2016 | Fujikawa | G09G 3/3648 345/100 |
| 2017/0302258 A1 | 10/2017 | De Oliveira et al. | |
| 2018/0198423 A1 | 7/2018 | Tokano et al. | |
| 2018/0302096 A1* | 10/2018 | Kuan | H03L 7/097 |
| 2018/0324378 A1 | 11/2018 | Ebihara et al. | |

OTHER PUBLICATIONS

Khot S.S., et al., "A 555/690 MSPS 4-Bit CMOS Flash ADC Using TIQ Comparator", IJEET, vol. 3, Issue: 2, Jul.-Sep. 2012, pp. 373-382.

Kim J., et al., "Simulation and Analysis of Random Decision Errors in Clocked Comparators", IEEE Transactions on Circuits and Systems-I: Regular Papers, vol. 56, No. 8, Aug. 2009, pp. 1844-1857.

Mongre R., et al., "Design of Low Power & High Speed Comparator with 0.18 μm Technology for ADC Application", Int. Journal of Engineering Research and Applications, vol. 4, Issue 8 (Version 1), Aug. 2014, pp. 146-153, ISSN : 2248-9622.

Partial International Search Report—PCT/US2019/061949—ISA/EPO—dated Feb. 14, 2020.

International Search Report and Written Opinion—PCT/US2019/061949—ISA/EPO—dated Apr. 29, 2020.

* cited by examiner

COMPARATORS FOR POWER AND HIGH-SPEED APPLICATIONS

RELATED APPLICATION

This application claims priority under 35 U.S.C. § 119(e) to U.S. Provisional Application No. 62/780,761 filed on Dec. 17, 2018, the entire specification of which is incorporated herein by reference.

BACKGROUND

Field

Aspects of the present disclosure relate generally to comparators, and more particularly, to comparators for power and high-speed applications.

Background

A comparator may be configured to compare two input voltages, and output an output signal indicating which one of the two input voltages is higher. Comparators may be used in a variety of devices including analog-to-digital converters (ADCs), time-to-digital converters (TDCs), delay-locked loops (DLLs), and other devices.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a comparator. The comparator includes a first inverter having an input, an output, and a voltage supply input, wherein the input of the first inverter and the output of the first inverter are coupled together, and the voltage supply input of the first inverter is configured to receive a first compare voltage. The comparator also includes a second inverter having an input, an output, and a voltage supply input, wherein the input of the second inverter is coupled to the output of the first inverter, and the voltage supply input of the second inverter is configured to receive a second compare voltage.

A second aspect relates to a comparator. The comparator includes a first inverter having an input, an output, and a voltage supply input, wherein the input of the first inverter and the output of the first inverter are coupled together. The comparator also includes a second inverter having an input, an output, and a voltage supply input, wherein the input of the second inverter is coupled to the output of the first inverter. The comparator further includes a first voltage-controlled resistor coupled between a voltage supply rail and the voltage supply input of the first inverter, and a second voltage-controlled resistor coupled between the voltage supply rail and the voltage supply input of the second inverter.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

One type of comparator includes a differential-pair amplifier. The differential-pair amplifier may require bias circuitry, multiple stages for rail-to-rail comparison, and large NMOS and PMOS stages for rail-to-rail comparison. Also, the differential-pair amplifier may be too slow for use in low-voltage differential high-speed applications with rail-to-rail output.

Another type of comparator includes a clocked strong-arm latch. The clocked strong-arm latch requires a high-frequency clock for high-speed comparison. Also, the clocked strong-arm latch may suffer from clock feedthrough and inject noise into nearby circuitry.

Yet another type of comparator is a threshold inverter quantization (TIQ) comparator. A TIQ comparator only compares one voltage with a fixed voltage, which limits its use and application.

Figure 1:
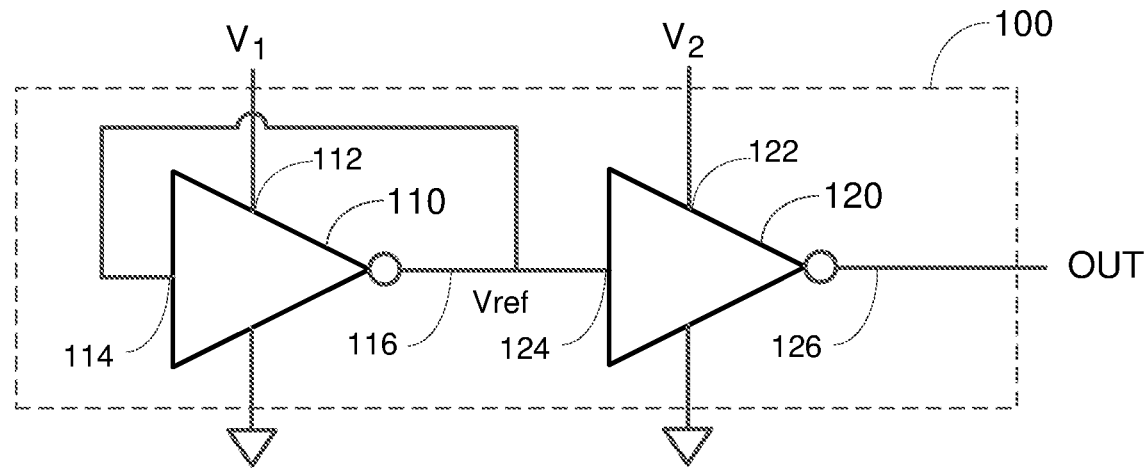
FIG. 1 shows an example of a comparator according to certain aspects of the present disclosure.

FIG. 1 shows an example of a comparator 100 according to certain aspects of the present disclosure. The comparator 100 is configured to compare a first voltage (labeled "$V_1$") with a second voltage (labeled "$V_2$"), and output an output signal at the output (labeled "OUT") of the comparator 100 indicating which one of the first voltage $V_1$ and the second voltage $V_2$ is higher. The first voltage $V_1$ and the second voltage $V_2$ may be referred to as a first compare voltage $V_1$ and a second compare voltage $V_2$, respectively, since they are voltages that are being compared by the comparator 100.

The comparator 100 includes a first inverter 110 and a second inverter 120. The first inverter 110 and the second inverter 120 may be identical or substantially identical. The first voltage $V_1$ is input to the voltage supply input 112 of the first inverter 110, and the second voltage $V_2$ is input to the voltage supply input 122 of the second inverter 120. In other words, the voltage supply input 112 of the first inverter 110 is configured to receive the first voltage $V_1$ and the voltage supply input 122 of the second inverter 120 is configured to receive the second voltage $V_2$. In one example, the first and second voltages $V_1$ and $V_2$ are supply voltages to be compared by the comparator 100 for a supply voltage comparison.

The output 116 of the first inverter 110 and the input 114 of the first inverter 110 are coupled together, which causes the first inverter 110 to self-bias in the high-gain region and output a reference voltage (labeled "Vref"). The reference voltage Vref may be approximately equal to the mid-point of the first voltage $V_1$ (i.e., approximately equal to $V_1/2$). The reference voltage Vref is input to the input 124 of the second inverter 120. The output 126 of the second inverter 120 provides the output of the comparator 100.

The second inverter 120 has an inverter threshold voltage associated with the input 124 of the second inverter 120. When the voltage input to the second inverter 120 (i.e., Vref) crosses the inverter threshold voltage, the output of the second inverter 120 flips logic states. The inverter threshold voltage is a function of the second voltage $V_2$ since the second voltage $V_2$ is input to the voltage supply input 122 of the second inverter 120. In one example, the inverter threshold voltage may be approximately equal to $V_2/2$. The inverter threshold voltage is not to be confused with the threshold voltage of a transistor.

In operation, the second inverter 120 outputs a logic one if the reference voltage Vref is below the inverter threshold voltage of the second inverter 120, and outputs a logic zero if the reference voltage Vref is above the inverter threshold voltage of the second inverter 120. Since the reference voltage Vref is a function of the first voltage V (e.g., approximately equal to $V_1/2$) and the inverter threshold voltage is a function of the second voltage $V_2$ (e.g., approximately equal to $V_2/2$), the logic state at the output 126 of the second inverter 120 depends on the first voltage $V_1$ and the second voltage $V_2$.

In one example, the reference voltage Vref (e.g., $V_1/2$) and the inverter threshold voltage (e.g., $V_2/2$) of the second inverter 120 are equal when the first voltage $V_1$ and the second voltage $V_2$ are equal. In this example, the reference voltage Vref is higher than the inverter threshold voltage when the first voltage $V_1$ is higher than the second voltage $V_2$. In this case, the second inverter 120 outputs a logic zero. The reference voltage Vref is lower than the inverter threshold voltage when the first voltage $V_1$ is lower than the second voltage $V_2$. In this case, the second inverter 120 outputs a logic one. Thus, in this example, the comparator 100 outputs a logic zero when the first voltage $V_1$ is higher than the second voltage $V_2$, and outputs a logic one when the first voltage $V_1$ is lower than the second voltage $V_2$.

Unlike a comparator employing a differential-pair amplifier, the comparator 100 does not require external bias circuitry. This is because the first inverter 110 is self-biased in the high-gain region by tying the input 114 and the output 116 of the first inverter 110 together.

Unlike a comparator employing a clocked strong-arm latch, the comparator 100 does not require a high-frequency clock. As a result, the comparator 100 does not suffer some of the drawbacks associated with a high-frequency clock such as clock feedthrough and noise injection into nearby circuitry caused by the high-frequency clock.

Unlike a TIQ comparator, the comparator 100 is not limited to comparing one voltage with a fixed voltage. While the comparator 100 may be used to compare one voltage with a fixed voltage, the comparator 100 may also be used to compare two non-fixed voltages.

Figure 2:
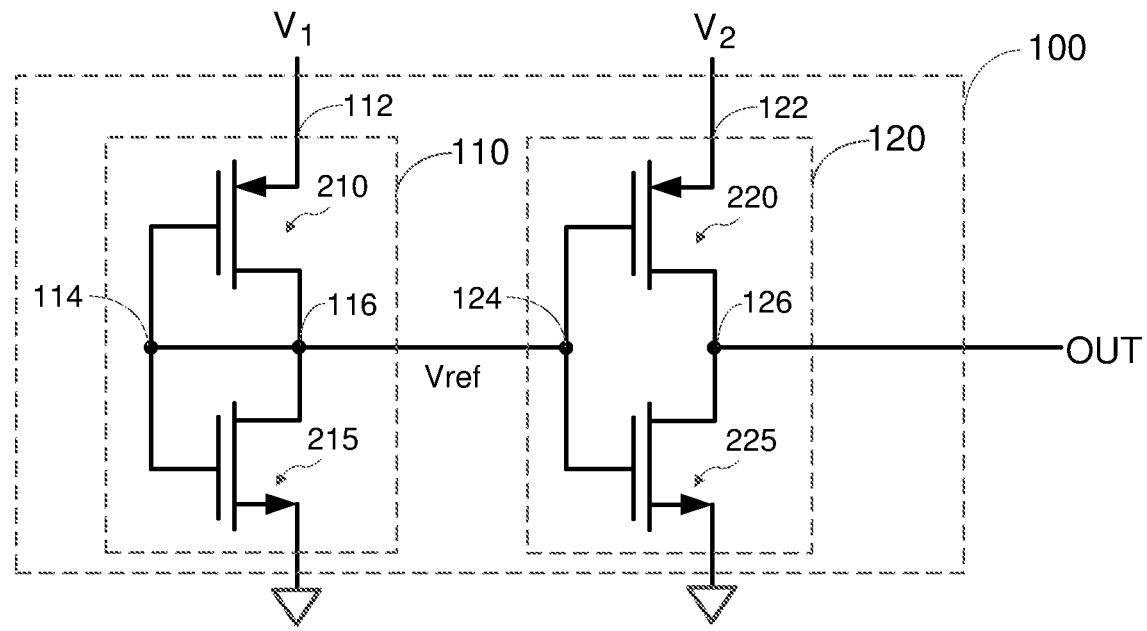
FIG. 2 shows an exemplary implementation of inverters in a comparator according to certain aspects of the present disclosure.

FIG. 2 shows an example in which each one of the first and second inverters 110 and 120 is implemented with a complementary metal oxide semiconductor (CMOS) inverter according to certain aspects of the present disclosure. In this example, the first inverter 110 includes a first p-type metal oxide semiconductor (PMOS) transistor 210 and a first n-type metal oxide semiconductor (NMOS) transistor 215. The source of the first PMOS transistor 210 is coupled to the voltage supply input 112 of the first inverter 110, the drain of the first PMOS transistor 210 is coupled to the output 116 of the first inverter 110, and the gate of the first PMOS transistor 210 is coupled to the input 114 of the first inverter 110. The drain of the first NMOS transistor 215 is coupled to the output 116 of the first inverter 110, the gate of the first NMOS transistor 215 is coupled to the input 114 of the first inverter 110, and the source of the first NMOS transistor 215 is coupled to ground. In one example, the first PMOS transistor 210 and the first NMOS transistor 215 are sized such that the reference voltage Vref is approximately equal to $V_1/2$.

The first inverter 110 is self-biased in the high-gain region where the current of the first PMOS transistor 210 is approximately equal to the current of the first NMOS transistor 215. As discussed above, the first inverter 110 is self-biased in the high-gain region by tying the input 114 and the output 116 of the first inverter 110 together.

The second inverter 120 includes a second PMOS transistor 220 and a second NMOS transistor 225. The source of the second PMOS transistor 220 is coupled to the voltage supply input 122 of the second inverter 120, the drain of the second PMOS transistor 220 is coupled to the output 126 of the second inverter 120, and the gate of the second PMOS transistor 220 is coupled to the input 124 of the second inverter 120. The drain of the second NMOS transistor 225 is coupled to the output 126 of the second inverter 120, the gate of the second NMOS transistor 225 is coupled to the input 124 of the second inverter 120, and the source of the second NMOS transistor 225 is coupled to ground. In one example, the second PMOS transistor 220 and the second NMOS transistor 225 are sized such that the inverter threshold voltage of the second inverter 120 is approximately equal to $V_2/2$.

In certain aspects, the comparator 100 may be calibrated so that the reference voltage Vref and the inverter threshold voltage of the second inverter 120 are approximately equal when the first and second voltages $V_1$ and $V_2$ are equal for different process-related and temperature-related offsets. In this regard, the first PMOS transistor 210 may be implemented with multiple PMOS transistors coupled in parallel, in which the number of the multiple PMOS transistors that are enabled at a given time is digitally controlled to control the strength of the first PMOS transistor 210. During calibration, the first and second voltages $V_1$ and $V_2$ are set to the same voltage level. The number of the multiple PMOS transistors that are enabled is then adjusted until the output of the comparator 100 toggles (i.e., flips logic states). At this point, the reference voltage Vref and the inverter threshold voltage of the second inverter 120 are approximately equal, and calibration is complete. It is to be appreciated that any one of the transistors in the comparator 100 may be implemented with multiple transistors coupled in parallel.

Figure 3:
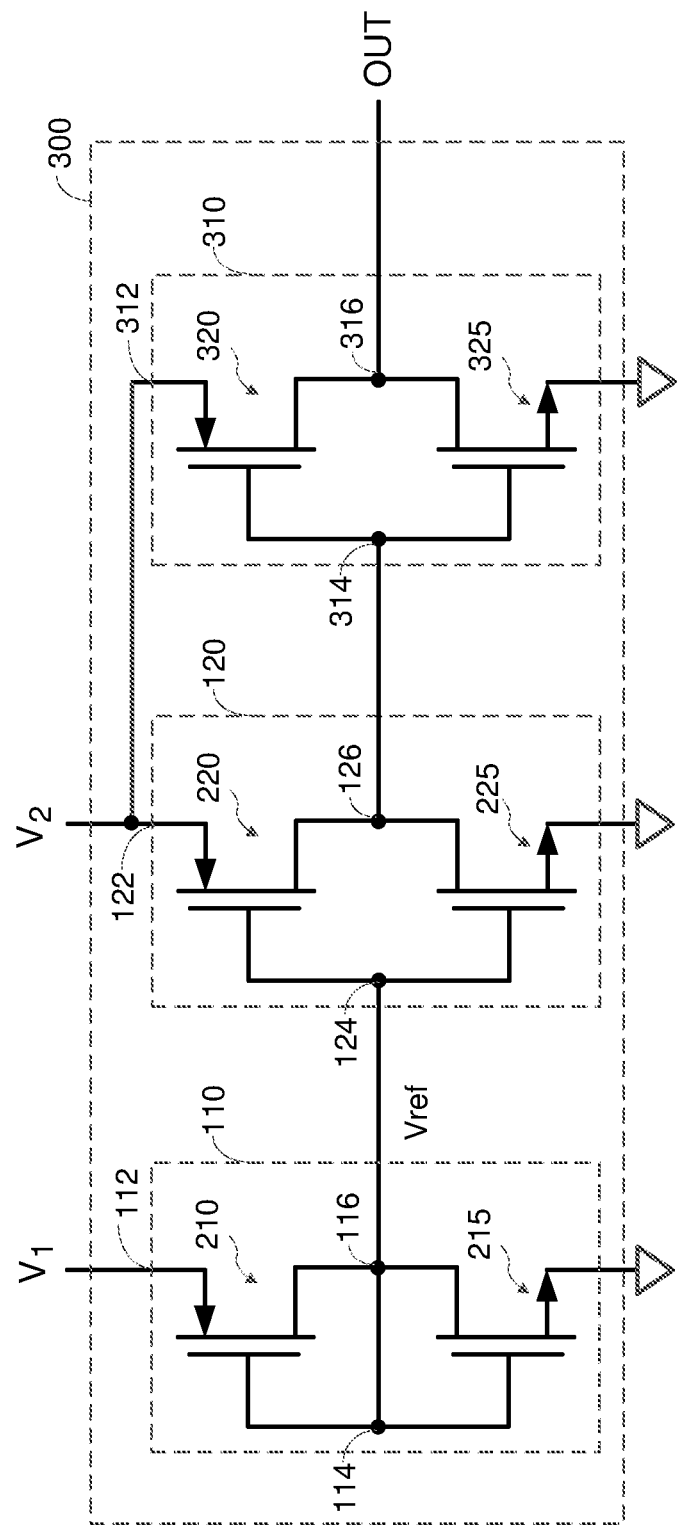
FIG. 3 shows an example of a comparator including an output buffer according to certain aspects of the present disclosure.

FIG. 3 shows another example of a comparator 300 according to certain aspects of the present disclosure. The comparator 300 includes the comparator 100 in FIG. 2 discussed above. The comparator 300 also includes a third inverter 310 coupled to the output 126 of the second inverter 120. In this example, the third inverter 310 acts as an output buffer stage to increase gain.

The voltage supply input 312 of the third inverter 310 is configured to receive the second voltage $V_2$, the input 314 of the third inverter 310 is coupled to the output 126 of the second inverter 120, and the output 316 of the third inverter 310 provides the output (labeled "OUT") of the comparator 300. In this example, the output of the comparator 300 is the logical inverse of the output of the comparator 100 in FIG. 2 because of the addition of the third inverter 310.

In the example in FIG. 3, the third inverter 310 is a CMOS inverter including a third PMOS transistor 320 and a third NMOS transistor 325. The source of the third PMOS transistor 320 is coupled to the voltage supply input 312 of the third inverter 310, the drain of the third PMOS transistor 320 is coupled to the output 316 of the third inverter 310, and the gate of the third PMOS transistor 320 is coupled to the input 314 of the third inverter 310. The drain of the third NMOS transistor 325 is coupled to the output 316 of the third inverter 310, the gate of the third NMOS transistor 325 is coupled to the input 314 of the third inverter 310, and the source of the third NMOS transistor 325 is coupled to ground.

Figure 4:
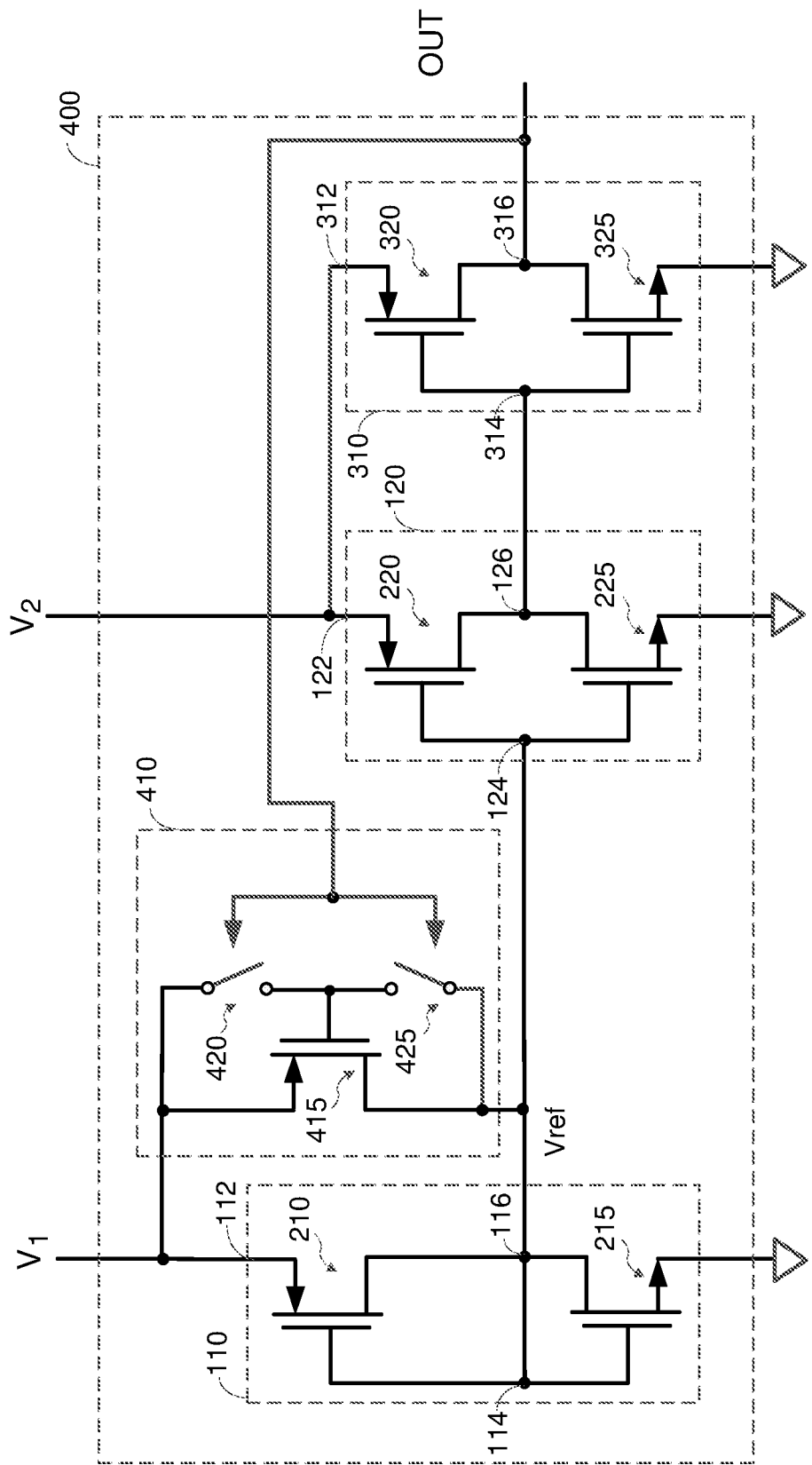
FIG. 4 shows an example of a comparator including a hysteresis circuit according to certain aspects of the present disclosure.

FIG. 4 shows another example of a comparator 400 according to certain aspects of the present disclosure. The comparator 400 includes the comparator 300 in FIG. 3 discussed above. The comparator 400 also includes a hysteresis circuit 410 configured to add hysteresis to the comparator 400. The hysteresis helps prevent the comparator output (labeled "OUT") from making multiple transitions due to noise when the first and second voltages $V_1$ and $V_2$ are close, as discussed further below.

In this example, the hysteresis circuit 410 includes a fourth PMOS transistor 415, a first switch 420, and a second switch 425. The fourth PMOS transistor 415 is coupled in parallel with the first PMOS transistor 210, in which the source of the fourth PMOS transistor 415 is coupled to the source of the first PMOS transistor 210, and the drain of the fourth PMOS transistor 415 is coupled to the drain of the first PMOS transistor 210.

The first switch 420 is coupled between the source and the gate of the fourth PMOS transistor 415, and the second switch 425 is coupled between the gate and the drain of the fourth PMOS transistor 415. In operation, one of the switches 420 and 425 is turned on at a time. When the first switch 420 is turned off (i.e., opened) and the second switch 425 is turned on (i.e., closed), the second switch 425 shorts the gate and the drain of the fourth PMOS transistor 415. In this case, the fourth PMOS transistor 415 is turned on (i.e., enabled) in parallel with the first PMOS transistor 210. As a result, the fourth PMOS transistor 415 pulls up the reference voltage Vref. The fourth PMOS transistor 415 may be sized so that the fourth PMOS transistor 415 pulls up the reference voltage Vref by a small amount when enabled, as discussed further below.

When the first switch 420 is turned on (i.e., closed) and the second switch 425 is turned off (i.e., opened), the first switch 420 shorts the source and the gate of the fourth PMOS transistor 415. In this case, the fourth PMOS transistor 415 is turned off (i.e., disabled), and the fourth PMOS transistor 415 does not pull up the reference voltage Vref.

Thus, in this example, the fourth PMOS transistor 415 pulls up the reference voltage Vref by a small amount when the fourth PMOS transistor 415 is enabled, and does not pull up the reference voltage Vref when the fourth PMOS transistor 415 is disabled. In certain aspects, the first and second switches 420 and 425 are controlled by the output of the comparator 400. In these aspects, the first switch 420 is configured to turn off and the second switch 425 is configured to turned on when the output of the comparator 400 has a first logic value (e.g., one). The first switch 420 is configured to turn on and the second switch 425 is configured to turn off when the output of the comparator 400 has a second logic value (e.g., zero). Thus, in this example, the fourth PMOS transistor 415 is enabled when the output has the first logic value (e.g., one), and is disabled when the output of has the second logic value (e.g., zero).

Figure 5:
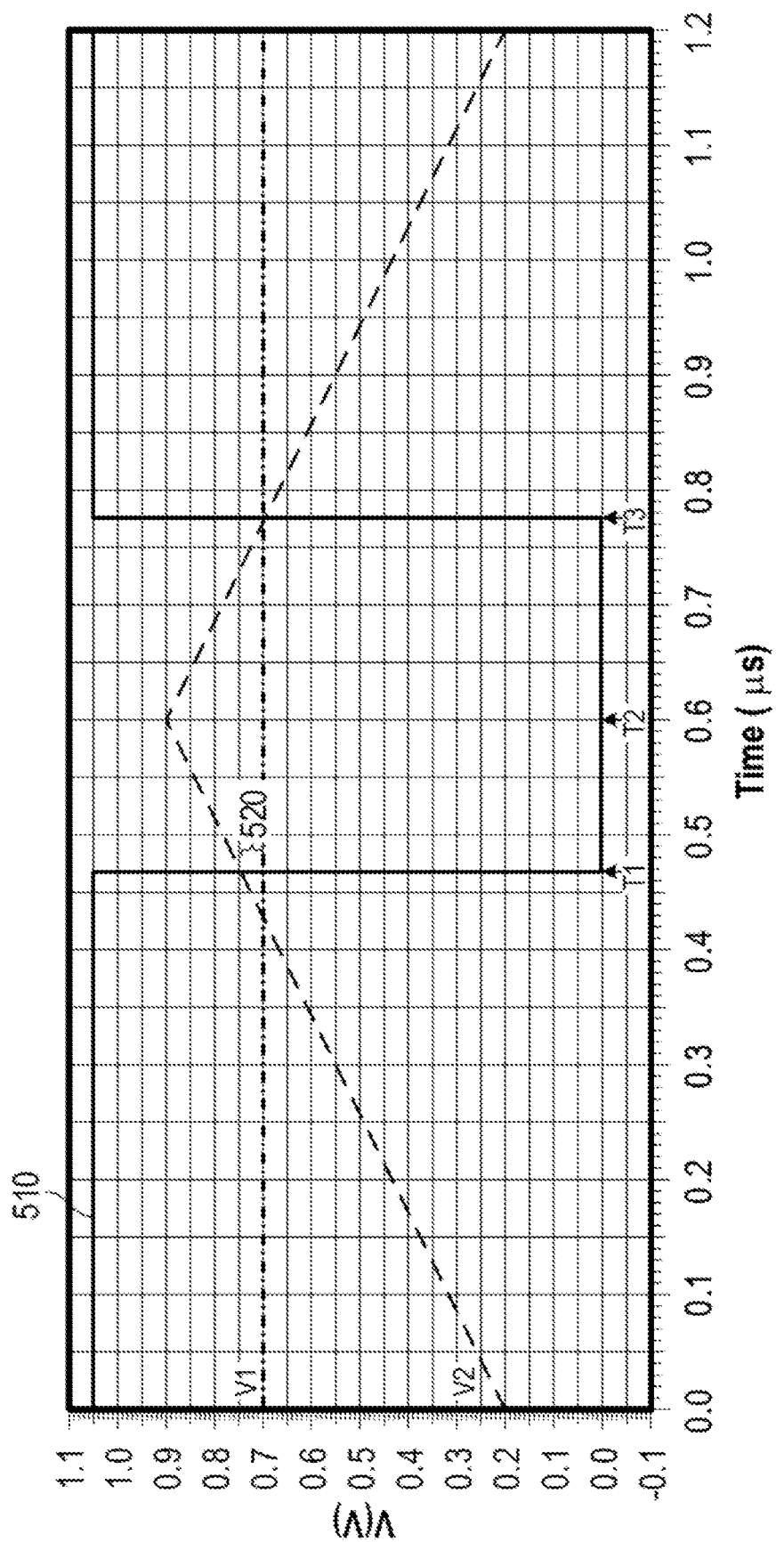
FIG. 5 shows an example of a timing diagram illustrating operation of the hysteresis circuit according to certain aspects of the present disclosure.

Exemplary operation of the hysteresis circuit 410 will now be described with reference to the timing diagram in FIG. 5. FIG. 5 shows an example of the comparator output 510, the first voltage $V_1$ and the second voltage $V_2$ over time. In this example, the first voltage $V_1$ voltage is fixed, and the second voltage $V_2$ is ramped up and down, as shown in FIG. 5. In this example, the fourth PMOS transistor 415 is enabled when the comparator output 510 is high (i.e., one) and disabled when the comparator output 510 is low (i.e., zero).

Initially, the second voltage $V_2$ is lower than the first voltage $V_1$, and the comparator output 510 is high (i.e., one). Also, the fourth PMOS transistor 415 is enabled since the comparator output 510 is high. The second voltage $V_2$ then ramps up and eventually crosses the first voltage $V_1$. In this example, the comparator output 510 does not transition from high to low until the second voltage $V_2$ rises above the first voltage $V_1$ by a small voltage offset 520 at time T1. This is due to the fact that the fourth PMOS transistor 415 pulls up the reference voltage Vref by a small amount when the fourth PMOS transistor 415 is enabled, as discussed above.

When the comparator output 510 goes low at time T1, the fourth PMOS transistor 415 is disabled. At time T2, the second voltage $V_2$ starts ramping down. The comparator output 510 transitions from low to high when the second voltage $V_2$ crosses below the first voltage $V_1$. There is no voltage offset 520 in this case because the fourth PMOS transistor 415 is disabled (i.e., turned off), and therefore does not pull up the reference voltage Vref by the small amount discussed above.

Thus, when the second voltage $V_2$ is rising, the comparator output 510 does not transition from high to low until the second voltage $V_2$ rises above the first voltage $V_1$ by the small voltage offset 520. When the second voltage $V_2$ is falling, the comparator output 510 transitions from low to high when the second voltage $V_2$ crosses below the first voltage $V_1$. The small voltage offset 520 helps prevent noise (e.g., noise on the first voltage $V_1$ and/or second voltage $V_2$) from causing multiple transitions in the comparator output 510 when the first voltage $V_1$ and the second voltage $V_2$ are close, assuming the noise is smaller than the voltage offset 520. The voltage offset 520 may be adjusted (e.g., by adjusting the size of the fourth PMOS transistor 415 relative to the size of the first PMOS transistor 210) so that expected noise is within the voltage offset 520.

Although the first voltage $V_1$ is fixed in the example shown in FIG. 5 to illustrate hysteresis, it is to be appreciated that the first voltage $V_1$ may be non-fixed. Also, it is to be appreciated that noise is not shown on the first and second voltages $V_1$ and $V_2$ in FIG. 5 for ease of illustration.

In the above example, the output of the second inverter 120 is the logical inverse of the output of the comparator 400. Thus, in this example, the first switch 420 is configured to turn on and the second switch 425 is configured to turn off when the output of the second inverter 120 has the first logic value (e.g., one), and the first switch 420 is configured to turn off and the second switch 425 is configured to turn on when the output of the second inverter 120 has the second logic value (e.g., zero).

Figure 6:
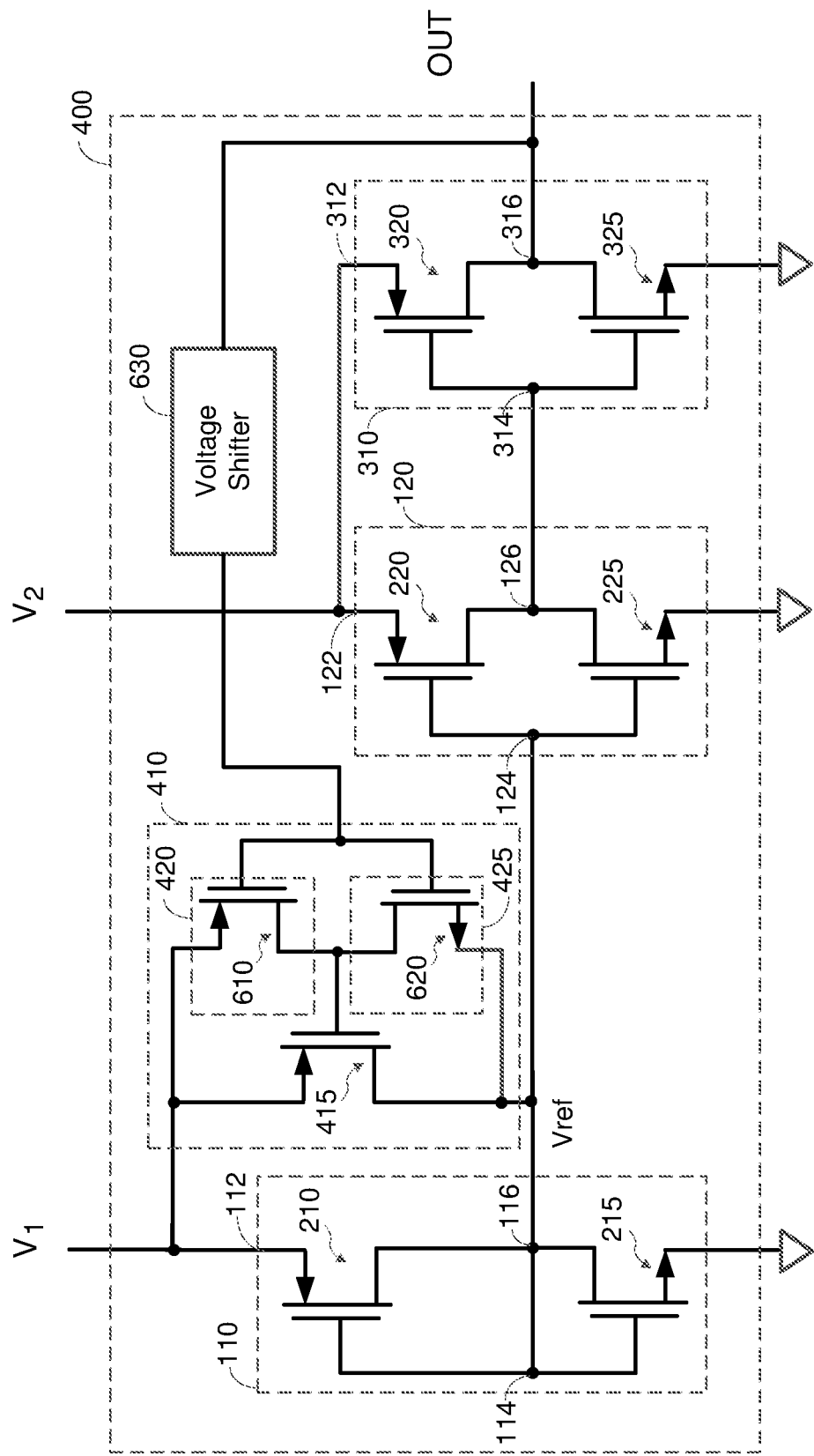
FIG. 6 shows an exemplary implementation of the hysteresis circuit according to certain aspects of the present disclosure.

FIG. 6 shows an example in which the first switch 420 is implemented with a switching PMOS transistor 610 and the second switch 425 is implemented with a switching NMOS transistor 620 according to certain aspects of the present disclosure. In this example, the source of the switching PMOS transistor 610 is coupled to the source of the fourth PMOS transistor 415, the gate of the switching PMOS transistor 610 is coupled to the output of the comparator 400, and the drain of the switching PMOS transistor 610 is coupled to the gate of the fourth PMOS transistor 415. The drain of the switching NMOS transistor 620 is coupled to the gate of the fourth PMOS transistor 415, the gate of the switching NMOS transistor 620 is coupled to the output of the comparator 400, and the source of the switching NMOS transistor 620 is coupled to the drain of the fourth PMOS transistor 415.

When the output of the comparator 400 is high, the switching PMOS transistor 610 is turned off and the switching NMOS transistor 620 is turned on. In this case, the fourth PMOS transistor 415 is enabled, in which the switching NMOS transistor 620 shorts the gate and the drain of the fourth PMOS transistor 415.

When the output of the comparator 400 is low, the switching PMOS transistor 610 is turned on and the switching NMOS transistor 620 is turned off. In this case, the fourth PMOS transistor 415 is disabled (i.e., turned off) since the switching PMOS transistor 610 shorts the source and the gate of the fourth PMOS transistor 415.

In some cases, the switching PMOS transistor 610 may be partially on when the output of the comparator 400 is high. This is because the voltage at the output of the comparator 400 is approximately equal to the second voltage $V_2$ when the output of the comparator 400 is high, and the second voltage $V_2$ may be lower than the first voltage $V_1$ in some cases. In these cases, the source-to-gate voltage of the switching PMOS transistor 610 is greater than zero volts when the output of the comparator 400 is high, which may cause the switching PMOS transistor 610 to be partially on when the output of the comparator 400 is high instead of fully turned off. To prevent this from happening, a voltage shifter 630 may be added between the output of the comparator 400 and the gate of the switching PMOS transistor 610, as shown in FIG. 6. In this example, when the output of the comparator 400 is high, the voltage shifter 630 may be configured to level shift the voltage at the output of the comparator 400 upward to a level-shifted voltage that is equal to or greater than the first voltage $V_1$, and input the level-shifted voltage to the gate of the switching PMOS transistor 610. The voltage level shifting helps ensure that the switching PMOS transistor 610 is turned off when the output of the comparator 400 is high.

Figure 7:
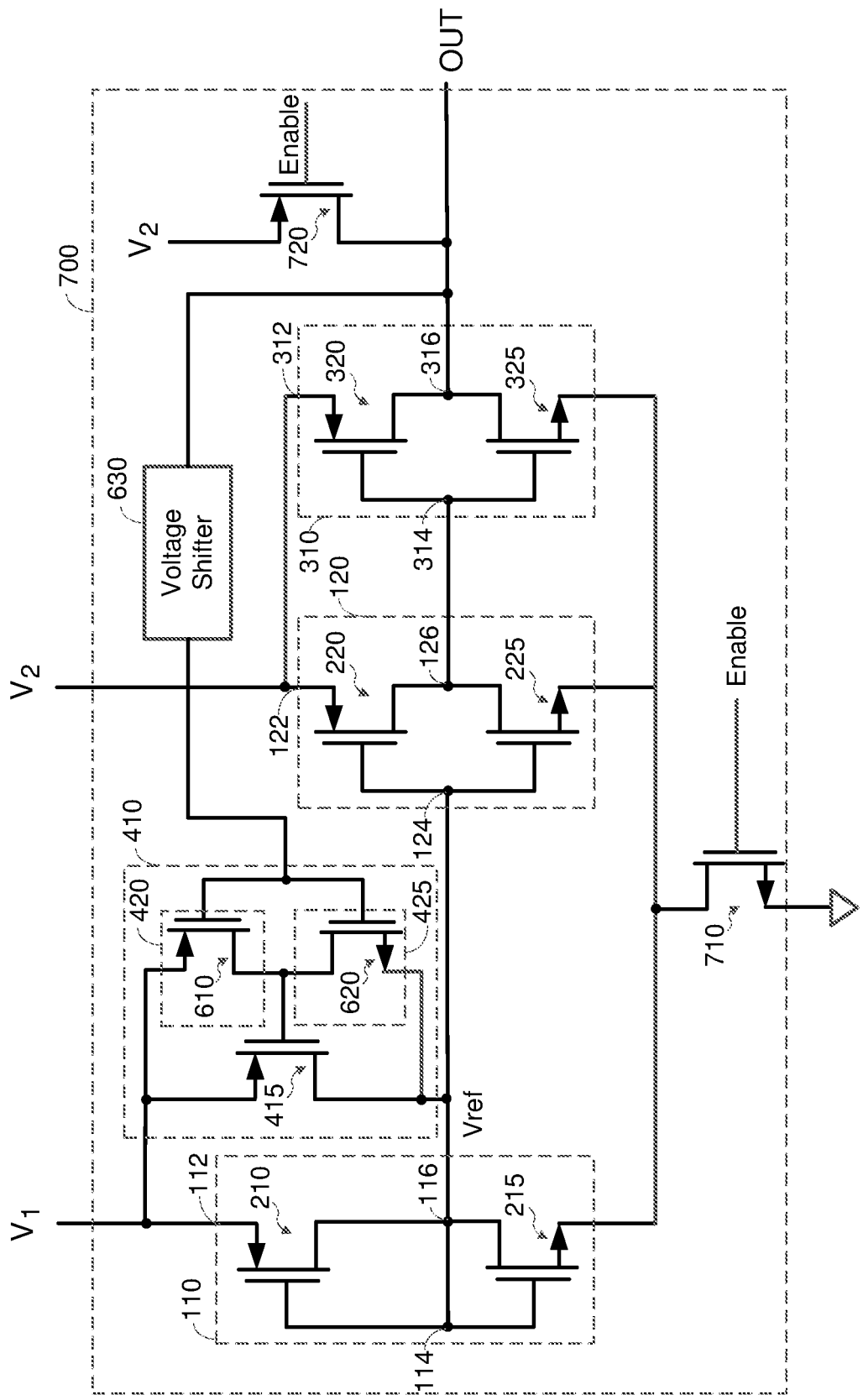
FIG. 7 shows an example of a comparator including an enable switch according to certain aspects of the present disclosure.

FIG. 7 shows another example of a comparator 700 according to certain aspects of the present disclosure. The comparator 700 includes the comparator 400 in FIG. 4 discussed above. The comparator 700 also includes an enable switch 710 for selectively enabling the comparator 700 based on an enable signal (labeled "Enable"). In the example in FIG. 7, the enable switch 710 is implemented with a fourth NMOS transistor, in which the drain of the fourth NMOS transistor is coupled to the sources of the first, second and third NMOS transistors 215, 225 and 325, the source of the fourth NMOS transistor is coupled to ground, and the enable signal is input to the gate of the fourth NMOS transistor.

When the enable signal has a first logic state (e.g., one), the enable switch 710 is turned on (i.e., closed). In this case, the enable switch 710 couples the sources of the first, second and third NMOS transistors 215, 225 and 325 to ground and the comparator 700 is enabled. When enabled, the comparator 700 operates in the manner discussed above. The comparator 700 may be enabled when the comparator 700 is needed.

When the enable signal has a second logic state (e.g., zero), the enable switch 710 is turned off (i.e., open). In this case, the enable switch 710 decouples the sources of the first, second and third NMOS transistors 215, 225 and 325 from ground and the comparator 700 is disabled. The comparator 700 may be disabled when the comparator 700 is not needed to conserve power.

An additional PMOS transistor 720 may be added to help ensure that the output of the comparator 700 has a well-defined logic state when the comparator 700 is disabled. In the example in FIG. 7, the source of the PMOS transistor 720 is coupled to the second voltage $V_2$, the drain of the PMOS transistor 720 is coupled to the output of the comparator 700, and the gate of the PMOS transistor 720 receives the enable signal. When the enable signal is high (i.e., the comparator 700 is enabled), the PMOS transistor 720 is turned off. When the enable signal is low (i.e., the comparator 700 is disabled), the PMOS transistor 720 is turned on. This causes the PMOS transistor 720 to pull the output of the comparator 700 high, giving the output of the comparator 700 a well-defined logic state of one.

In some applications (e.g., signal comparison), it is desirable for the inputs of a comparator to have high impedances so that the inputs of the comparator draw (i.e., pull) little to no current from the sources of the first and second voltages $V_1$ and $V_2$. This is because current drawn by the inputs of the comparator may impact the voltages being compared by the comparator. For example, if one of the voltages being compared is on a signal line, then current drawn by the respective input of the comparator may cause an IR drop in the signal line that reduces the voltage. To address this, aspects of the present disclosure provide comparators having high input impedances, as discussed further below.

Figure 8:
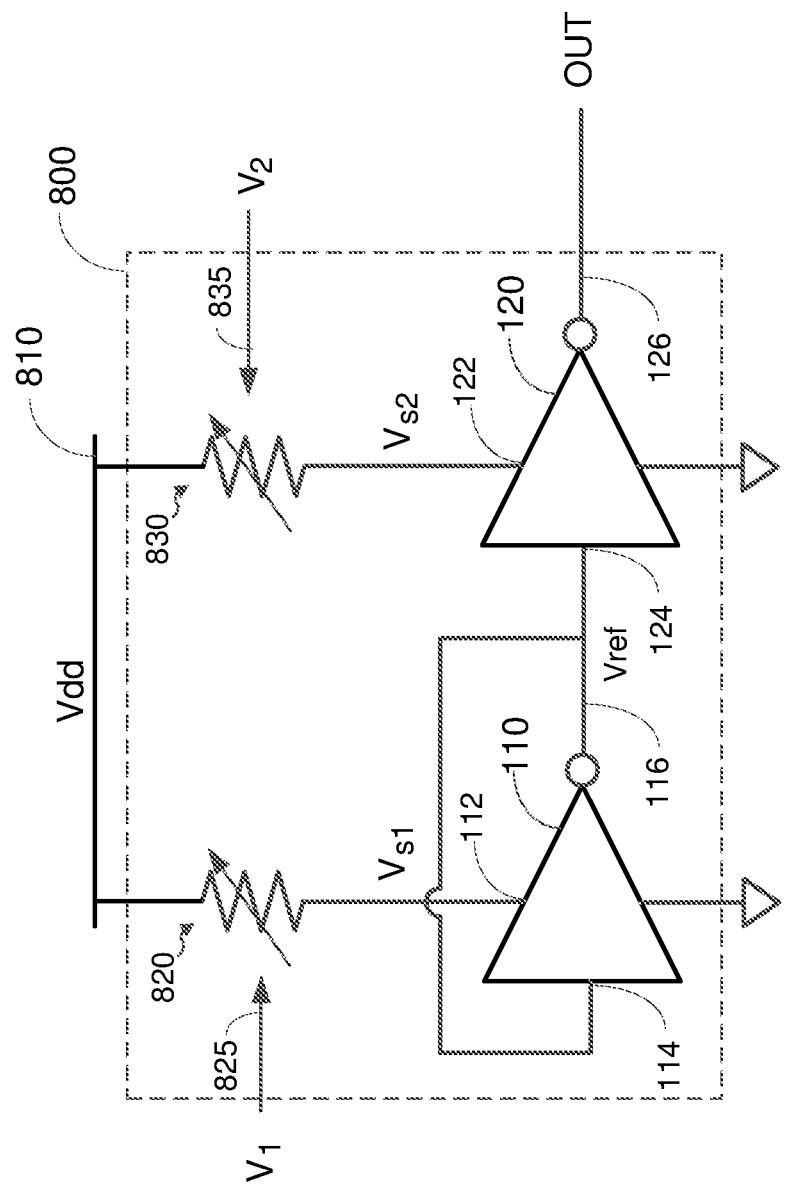
FIG. 8 shows an example of a comparator including voltage-controlled resistors according to certain aspects of the present disclosure.

FIG. 8 shows an example of a comparator 800 having high input impedances according to certain aspects of the present disclosure. The comparator 800 includes the first inverter 110 and the second inverter 120 discussed above, in which the input 114 and the output 116 of the first inverter 110 are coupled together, the input 124 of the second inverter 120 is coupled to the output 116 of the first inverter 110, and the output 126 of the second inverter 120 provides the output of the comparator 800. The first inverter 110 and the second inverter 120 may be implemented with the CMOS inverters shown in FIG. 2.

The comparator 800 also includes a first voltage-controlled resistor 820 and a second voltage-controlled resistor 830. The first voltage-controlled resistor 820 is coupled between a voltage supply rail 810 and the voltage supply input 112 of the first inverter 110. The second voltage-controlled resistor 830 is coupled between the voltage supply rail 810 and the voltage supply input 122 of the second inverter 120. The supply voltage on the supply rail 810 is Vdd.

The first voltage-controlled resistor 820 has a control input 825 for controlling the resistance of the first voltage-controlled resistor 820. The resistance of the first voltage-controlled resistor 820 is between the supply rail 810 and the supply input 112 of the first inverter 110. In the example in FIG. 8, the first voltage $V_1$ is input to the control input 825 to control the resistance of the first voltage-controlled resistor 820. The voltage (labeled "$V_{s1}$") at the supply input 112 of the first inverter 110 is approximately equal to Vdd minus the voltage drop across the first voltage-controlled resistor 820. The voltage drop across the first voltage-controlled resistor 820 is a function of the resistance of the first voltage-controlled resistor 820, which is controlled by the first voltage $V_1$. Thus, the voltage $V_{s1}$ at the supply input 112 of the first inverter 110 is a function of the first voltage $V_1$. The voltage $V_{s1}$ may be considered a supply voltage that is input to the supply input 112 of the first inverter 110, in which the supply voltage $V_{s1}$ is equal to the supply voltage at the supply rail 810 minus the voltage drop across the first voltage-controlled resistor 820, and the supply voltage $V_{s1}$ is adjusted by adjusting the resistance of the first voltage-controlled resistor 820.

The second voltage-controlled resistor 830 has a control input 835 for controlling the resistance of the second voltage-controlled resistor 830. The resistance of the second voltage-controlled resistor 830 is between the supply rail 810 and the supply input 122 of the second inverter 120. In the example in FIG. 8, the second voltage $V_2$ is input to the control input 835 to control the resistance of the second voltage-controlled resistor 830. The voltage (labeled "$V_{s2}$") at the supply input 122 of the second inverter 120 is approximately equal to Vdd minus the voltage drop across the second voltage-controlled resistor 830. The voltage drop across the second voltage-controlled resistor 830 is a function of the resistance of the second voltage-controlled resistor 830, which is controlled by the second voltage $V_2$. Thus, the voltage $V_{s2}$ at the supply input 122 of the second inverter 120 is a function of the second voltage $V_2$. The voltage $V_{s2}$ may be considered a supply voltage that is input to the supply input 122 of the second inverter 110, in which the supply voltage $V_{s2}$ is equal to the supply voltage at the supply rail 810 minus the voltage drop across the second voltage-controlled resistor 830, and the supply voltage $V_{s2}$ is adjusted by adjusting the resistance of the second voltage-controlled resistor 830.

In one example, each one of the first and second voltage-controlled resistors 820 and 830 is configured to decrease the respective resistance with a decrease in the voltage at the respective control input, and increase the respective resistance with an increase in the voltage at the respective control input. In this example, each one of the first and second voltage-controlled resistors 820 and 830 may be implemented with a respective PMOS transistor, as discussed further below.

In this example, when the first voltage $V_1$ is higher than the second voltage $V_2$, the resistance of the first voltage-controlled resistor 820 is greater than the resistance of the second voltage-controlled resistor 830. As a result, the voltage drop across the first voltage-controlled resistor 820 is greater than the voltage drop across the second voltage-controlled resistor 830, and the voltage $V_{s1}$ at the supply input 112 of the first inverter 110 is lower than the voltage $V_{s2}$ at the supply input 122 of the second inverter 120. In this case, the reference voltage Vref output by the first inverter 110 is lower than the inverter threshold voltage of the second inverter 120, causing the comparator 800 to output a one.

When the first voltage $V_1$ is lower than the second voltage $V_2$, the resistance of the first voltage-controlled resistor 820 is less than the resistance of the second voltage-controlled resistor 830. As a result, the voltage drop across the first voltage-controlled resistor 820 is less than the voltage drop across the second voltage-controlled resistor 830, and the voltage $V_{s1}$ at the supply input 112 of the first inverter 110 is higher than the voltage $V_{s2}$ at the supply input 122 of the second inverter 120. In this case, the reference voltage Vref output by the first inverter 110 is higher than the inverter threshold voltage of the second inverter 120, causing the comparator 800 to output a zero.

Thus, in the above example, the comparator 800 outputs a one when the first voltage $V_1$ is higher than the second voltage $V_2$, and outputs a zero when the first voltage $V_1$ is lower than the second voltage $V_2$.

In another example, each one of the first and second voltage-controlled resistors 820 and 830 is configured to increase the respective resistance with a decrease in the voltage at the respective control input, and decrease the respective resistance with an increase in the voltage at the respective control input. In this example, the comparator 800 outputs a zero when the first voltage $V_1$ is higher than the second voltage $V_2$, and outputs a one when the first voltage $V_1$ is lower than the second voltage $V_2$. Thus, the output of the comparator 800 in this example is the logical inverse of the output of the comparator 800 in the previous example.

In certain aspects, the control inputs 825 and 835 of the voltage-controlled resistors 820 and 835 have high impedances to provide the comparator 800 with high input impedances. For example, each voltage-controlled resistor 820 and 830 may be implemented with a respective transistor (e.g., PMOS transistor or NMOS transistor) having a channel coupled between the supply rail 810 and the voltage supply input of the respective inverter. In this example, the resistance of each voltage-controlled resistor 820 and 830 corresponds to the channel resistance of the respective transistor, which is controlled by the gate voltage of the respective transistor. In this example, the control input of each voltage-controlled resistor 820 and 830 is located at the gate of the respective transistor, which has a high input impedance.

In contrast, each input of the comparator 100 shown in FIG. 2 is located at the source of the first PMOS transistor 210 or the source of the second PMOS transistor 220, which has a low input impedance. In this case, the channel widths of the first PMOS transistor 210 and the first NMOS transistor 215 may be made small to keep the current drawn by the first inverter 110 small. In the second inverter 120, the second PMOS transistor 220 or the second NMOS transistor 225 is turned off when $V_1$ and $V_2$ are not equal. Thus, the second inverter 120 may drawn little to no current most of the time. Current drawn by the comparator 100 may be less of an issue for a supply voltage comparison since the supply rails that provide the supply voltages being compared may be configured to source relatively large amounts of currents (i.e., much larger than the current consumed by the comparator 100). In this case, the current drawn by the comparator 100 may have a negligible effect on the supply voltages being compared.

Figure 9:
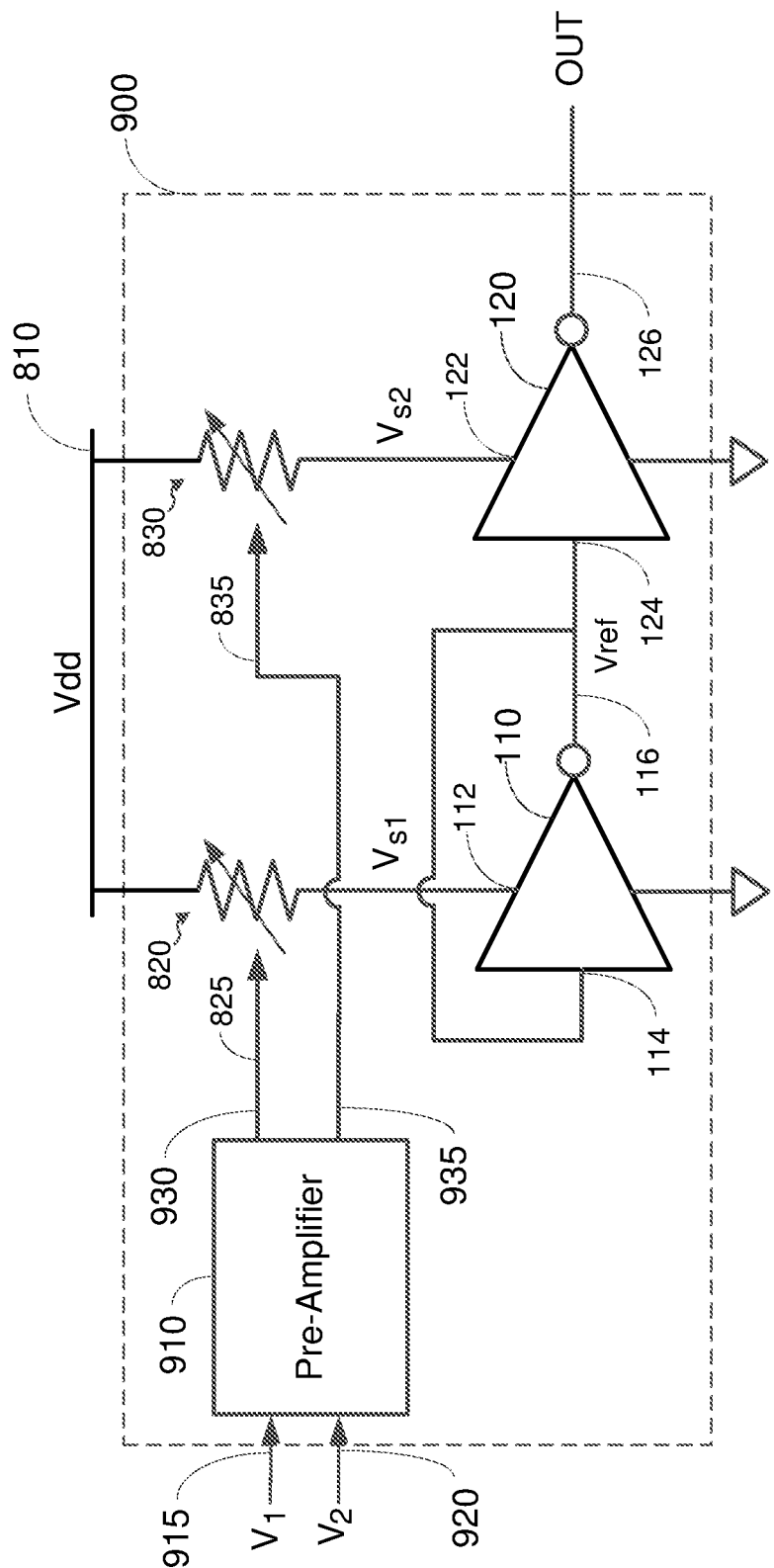
FIG. 9 shows an example of a comparator including a pre-amplifier according to certain aspects of the present disclosure.

FIG. 9 shows another example of a comparator 900 according to certain aspects of the present disclosure. The comparator 900 includes the comparator 800 discussed above with reference to FIG. 8. In addition, the comparator 900 includes a pre-amplifier 910 that provides additional gain at the comparator inputs. The pre-amplifier 910 includes a first input 915, a second input 920, a first output 930, and a second output 935. In the example in FIG. 9, the first voltage $V_1$ is input to the first input 915 of the pre-amplifier 910, and the second voltage $V_2$ is input to the second input 920 of the pre-amplifier 910. The first output 930 of the pre-amplifier 910 is coupled to the control input 825 of the first voltage-controlled resistor 820, and the second output 935 of the pre-amplifier 910 is coupled to the control input 835 of the second voltage-controlled resistor 830. Thus, in this example, the voltage at the first output 930 of the pre-amplifier 910 controls the resistance of the first voltage-controlled resistor 820, and the voltage at the second output 935 of the pre-amplifier 910 controls the resistance of the second voltage-controlled resistor 830.

The pre-amplifier 910 generates the voltages at the first and second outputs 930 and 935 based on the first and second voltages $V_1$ and $V_2$ input to the pre-amplifier 910. In one example, the pre-amplifier 910 amplifies the first voltage $V_1$ by a first gain to generate the voltage at the first output 930 of the pre-amplifier 910, and amplifies the second voltage $V_2$ by a second gain to generate the voltage at the second output 935 of the pre-amplifier 910. The first and second gains may be approximately the same. In this example, the voltage at the first output 930 may be given by $V_1 \cdot G_1$ or $(V_1 \cdot G_1) + Vb_1$, where $G_1$ is the first gain of the pre-amplifier 910 and $Vb_1$ is a first bias voltage of the pre-amplifier 910. Also, in this example, the voltage at the second output 935 may be given by $V_2 \cdot G_2$ or $(V_2 \cdot G_2) + Vb_2$, where $G_2$ is the second gain of the pre-amplifier 910 and $Vb_2$ is a second bias voltage of the pre-amplifier 910. The first and second bias voltages may be approximately the same.

In another example, the pre-amplifier 910 amplifies a first differential voltage of $V_1$ and $V_2$ by a first gain to generate the voltage at the first output 930 of the pre-amplifier 910, and amplifies a second differential voltage of $V_1$ and $V_2$ by a second gain to generate the voltage at the second output 935 of the pre-amplifier 910. The first and second gains may be approximately the same. In this example, the first differential voltage may be approximately equal to $V_1 - V_2$, and the second differential voltage may be approximately equal to $V_2 - V_1$ or vice versa. In this example, the voltage at the first output 930 may be given by $V_{diff\_1} \cdot G_1$ or $(V_{diff\_1} \cdot G_1) + Vb_1$, where $V_{diff\_1}$ is the first differential voltage, $G_1$ is the first gain of the pre-amplifier 910, and $Vb_1$ is a first bias voltage of the pre-amplifier 910. Also, in this example, the voltage at the second output 935 may be given by $V_{diff\_2} \cdot G_2$ or $(V_{diff\_2} \cdot G_2) + Vb_2$, where $V_{diff\_2}$ is the second differential voltage, $G_2$ is the second gain of the pre-amplifier 910, and $Vb_2$ is a second bias voltage of the pre-amplifier 910. The first and second bias voltages may be approximately the same.

Figure 10:
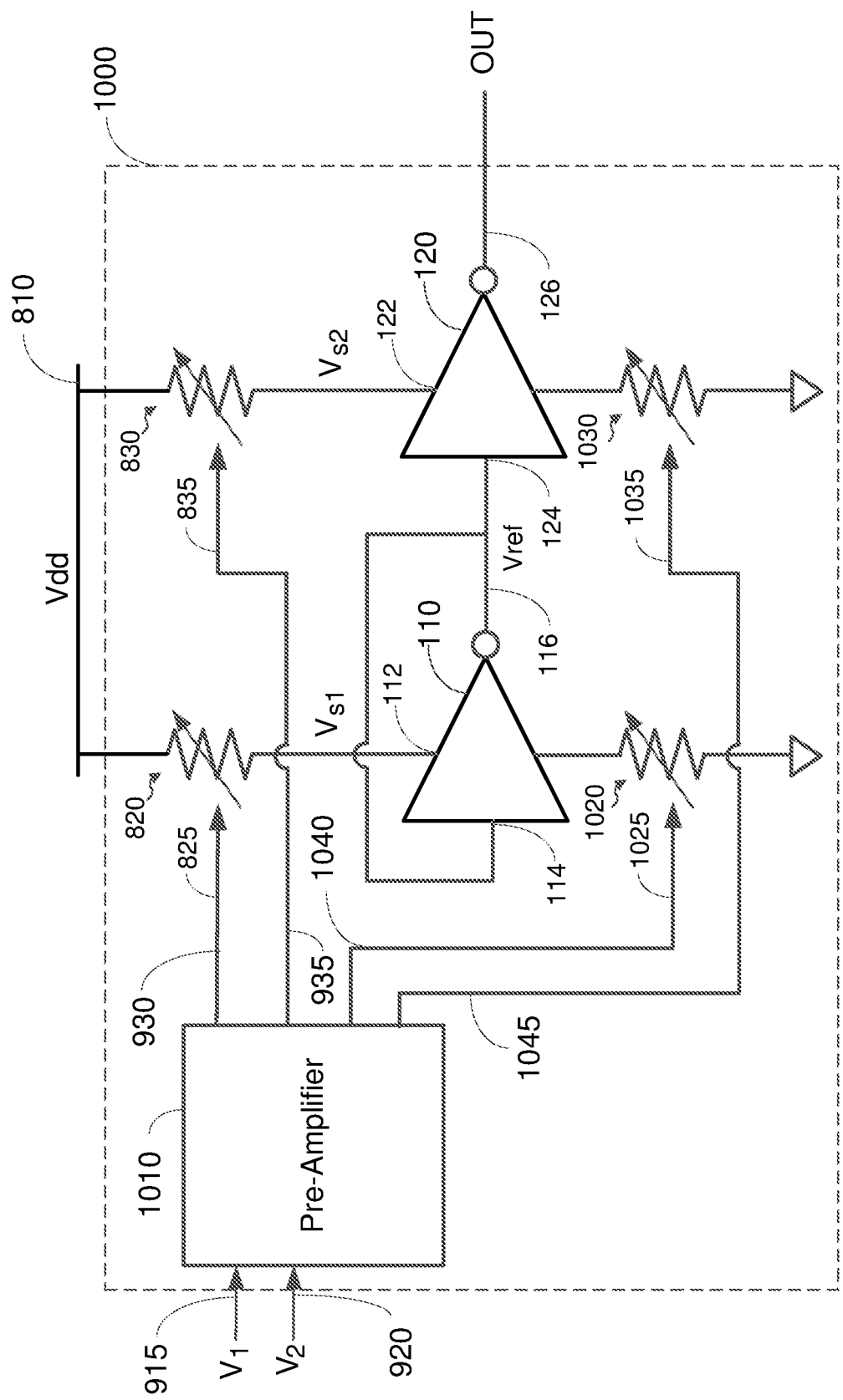
FIG. 10 shows another example of a comparator including voltage-controlled resistors according to certain aspects of the present disclosure.

FIG. 10 shows another example of a comparator 1000 according to certain aspects of the present disclosure. The comparator 1000 includes the comparator 900 shown in FIG. 9. In addition, the comparator 1000 includes a third voltage-controlled resistor 1020 and a fourth voltage-controlled resistor 1030. The third voltage-controlled resistor 1020 is coupled between the first inverter 110 and ground. The third voltage-controlled resistor 1020 has a control input 1025 for controlling the resistance of the third voltage-controlled resistor 1020, in which the resistance of the third voltage-controlled resistor 1020 is between the first inverter 110 and ground. The fourth voltage-controlled resistor 1030 is coupled between the second inverter 120 and ground. The fourth voltage-controlled resistor 1030 has a control input 1035 for controlling the resistance of the fourth voltage-controlled resistor 1030, in which the resistance of the fourth voltage-controlled resistor 1030 is between the second inverter 120 and ground. As discussed further below, the third voltage-controlled resistor 1020 and the fourth voltage-controlled resistor 1030 are used to increase the speed of the comparator 1000 to provide higher speed comparison.

In this example, the pre-amplifier 1010 includes the first input 915, the second input 920, the first output 930, and the second output 935 discussed above. In this regard, the pre-amplifier 1010 may generate the voltages at the first and second outputs 930 and 935 based on the first and second voltages $V_1$ and $V_2$ in the manner discussed above with reference to FIG. 9. In addition, the pre-amplifier 1010 includes a third output 1040 coupled to the control input 1025 input of the third voltage-controlled resistor 1020, and a fourth output 1045 coupled to the control input 1035 input of the fourth voltage-controlled resistor 1030. Thus, the pre-amplifier 1010 controls the resistance of the third voltage-controlled resistor 1020, and the resistance of the fourth voltage-controlled resistor 1030, as discussed further below.

In operation, the pre-amplifier 1010 is configured to adjust the resistance of the third voltage-controlled resistor 1020 in an opposite direction as the resistance of the first voltage-controlled resistor 820. For example, when the pre-amplifier 1010 decreases the resistance of the first voltage-controlled resistor 820 due to a change in the first voltage $V_1$ and/or the second voltage $V_2$, the pre-amplifier 1010 increases the resistance of the third voltage-controlled resistor 1020. The decrease in the resistance of the first voltage-controlled resistor 820 raises the voltage $V_{s1}$ at the supply input 112 of the first inverter 110, which raises the reference voltage Vref (i.e., shifts Vref up). The increase in the resistance of the third voltage-controlled resistor 1020 increases the resistance between the first inverter 110 and ground, which reduces the current flow from the first inverter 110 to ground. This allows the first voltage-controlled resistor 820 to pull up the voltage $V_{s1}$ faster since the first voltage-controlled resistor 820 is fighting less current from the first inverter 110 to ground to raise the voltage $V_{s1}$. Thus, by adjusting the resistance of the third voltage-controlled resistor 1020 in the opposite direction as the resistance of the first voltage-controlled resistor 820, the pre-amplifier 1010 is able to move the voltage $V_{s1}$ at the supply input 112 of the first inverter 110 faster in response to a change in the first voltage $V_1$ and/or the second voltage $V_2$, thereby increasing the speed of the comparator 1000.

The pre-amplifier 1010 is also configured to adjust the resistance of the fourth voltage-controlled resistor 1030 in an opposite direction as the resistance of the second voltage-controlled resistor 830. This allows the pre-amplifier 1010 to move the voltage $V_{s2}$ at the supply input 122 of the second inverter 120 faster in response to a change in the first voltage $V_1$ and/or the second voltage $V_2$.

Figure 11:
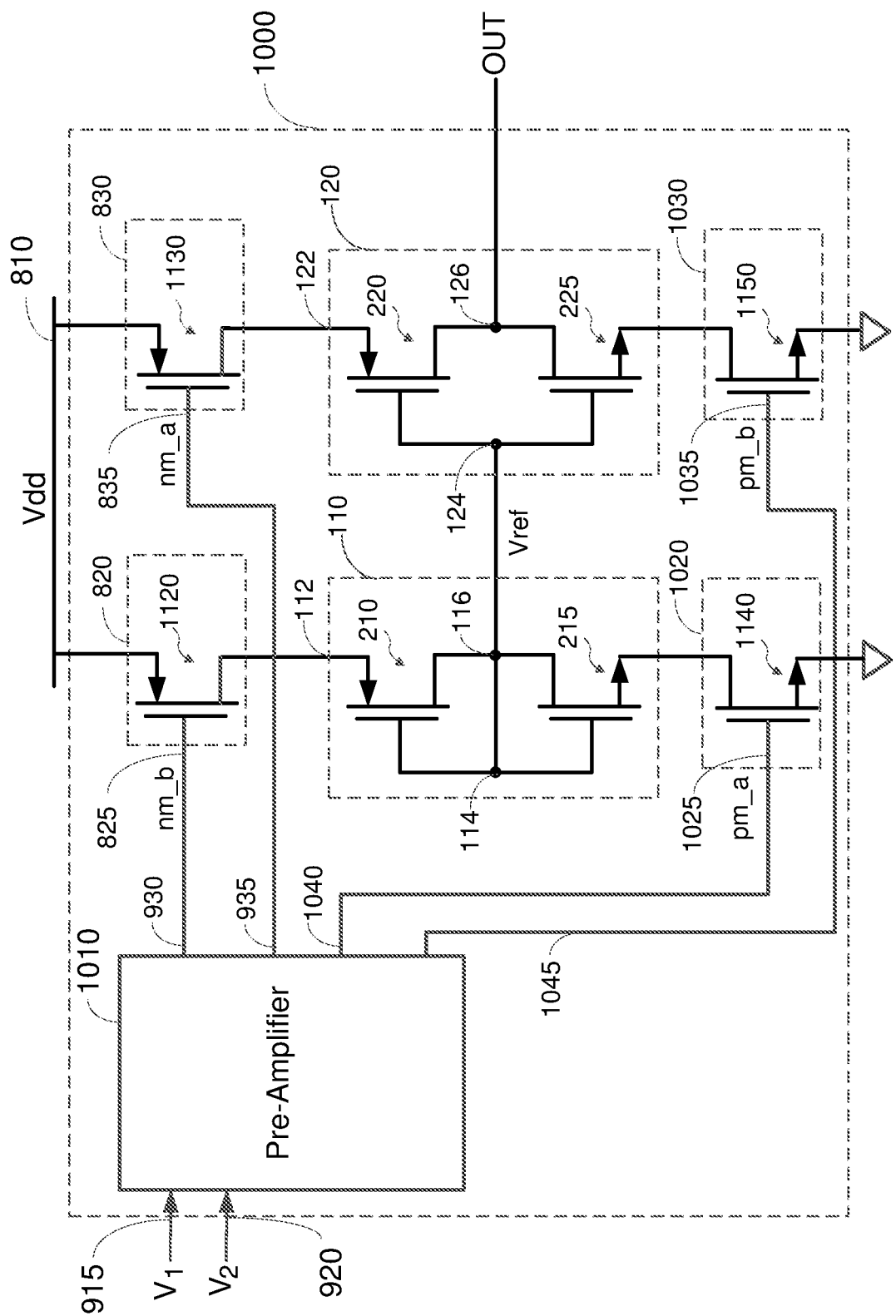
FIG. 11 shows an exemplary implementation of the voltage-controlled resistors according to certain aspects of the present disclosure.

FIG. 11 shows an exemplary implementation of the first inverter 110, the second inverter 120, the first voltage-controlled resistor 820, the second voltage-controlled resistor 830, the third voltage-controlled resistor 1020, and the fourth voltage-controlled resistor 1030 according to aspects of the present disclosure. In this example, the first and second inverters 110 and 120 are implemented with the respective CMOS inverters shown in FIG. 2. The detailed description of the CMOS inverters provided above with reference to FIG. 2 applies to the CMOS inverters shown in FIG. 11, and is therefore not repeated here for brevity.

In this example, the first voltage-controlled resistor 820 is implemented with a fifth PMOS transistor 1120, in which the control input 825 of the first voltage-controlled resistor 820 is located at the gate of the fifth PMOS transistor 1120. The source of the fifth PMOS transistor 1120 is coupled to the supply rail 810, the drain of the fifth PMOS transistor 1120 is coupled to the voltage supply input 112 of the first inverter 110, and the gate of the fifth PMOS transistor 1120 is coupled to the first output 930 of the pre-amplifier 1010. In this example, the pre-amplifier 1010 decreases the resistance of the fifth PMOS transistor 1120 by decreasing the gate voltage (labeled "nm_b") of the fifth PMOS transistor 1120, and increases the resistance of the fifth PMOS transistor 1120 by increasing the gate voltage nm_b of the fifth PMOS transistor 1120.

The second voltage-controlled resistor 830 is implemented with a sixth PMOS transistor 1130, in which the control input 835 of the second voltage-controlled resistor 830 is located at the gate of the sixth PMOS transistor 1130. The source of the sixth PMOS transistor 1130 is coupled to the supply rail 810, the drain of the sixth PMOS transistor 1130 is coupled to the voltage supply input 122 of the second inverter 120, and the gate of the sixth PMOS transistor 1130 is coupled to the second output 935 of the pre-amplifier 1010. In this example, the pre-amplifier 1010 decreases the resistance of the sixth PMOS transistor 1130 by decreasing the gate voltage (labeled "nm_a") of the sixth PMOS transistor 1130, and increases the resistance of the sixth PMOS transistor 1130 by increasing the gate voltage nm_a of the sixth PMOS transistor 1130.

The third voltage-controlled resistor 1020 is implemented with a fifth NMOS transistor 1140, in which the control input 1025 of the third voltage-controlled resistor 1020 is located at the gate of the fifth NMOS transistor 1140. The drain of the fifth NMOS transistor 1140 is coupled to the source of the first NMOS transistor 215, the source of the fifth NMOS transistor 1140 is coupled to ground, and the gate of the fifth NMOS transistor 1140 is coupled to the third output 1040 of the pre-amplifier 1010. In this example, the pre-amplifier 1010 decreases the resistance of the fifth NMOS transistor 1140 by increasing the gate voltage (labeled "pm_a") of the fifth NMOS transistor 1140, and increases the resistance of the fifth NMOS transistor 1140 by decreasing the gate voltage pm_a of the fifth NMOS transistor 1140.

The fourth voltage-controlled resistor 1030 is implemented with a sixth NMOS transistor 1150, in which the control input 1035 of the fourth voltage-controlled resistor 1030 is located at the gate of the sixth NMOS transistor 1150. The drain of the sixth NMOS transistor 1150 is coupled to the source of the second NMOS transistor 225, the source of the sixth NMOS transistor 1150 is coupled to ground, and the gate of the sixth NMOS transistor 1150 is coupled to the fourth output 1045 of the pre-amplifier 1010. In this example, the pre-amplifier 1010 decreases the resistance of the sixth NMOS transistor 1150 by increasing the gate voltage (labeled "pm_b") of the sixth NMOS transistor 1150, and increases the resistance of the sixth NMOS transistor 1150 by decreasing the gate voltage pm_b of the sixth NMOS transistor 1150.

Figure 12:
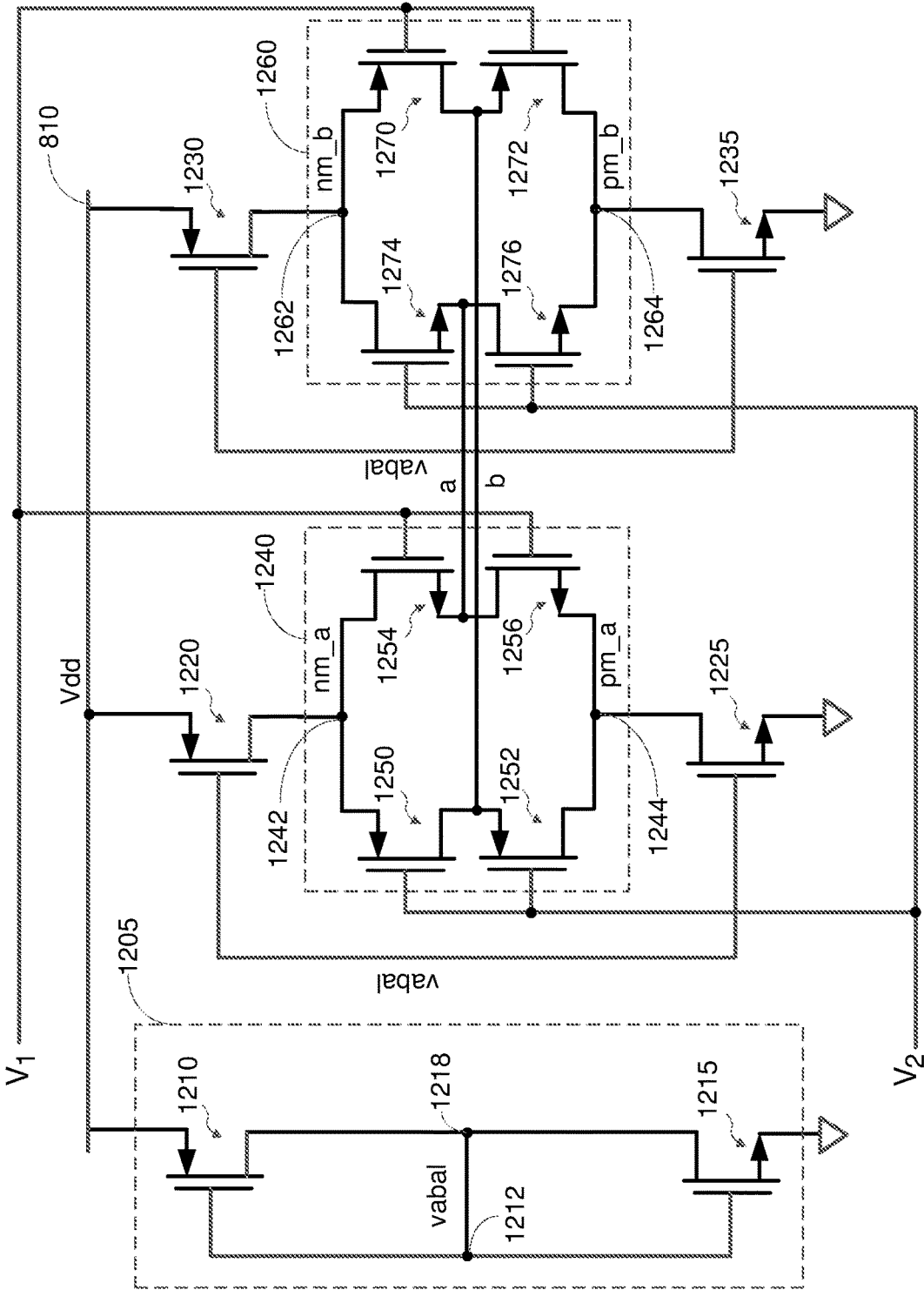
FIG. 12 shows an exemplary implementation of the pre-amplifier according to certain aspects of the present disclosure.

FIG. 12 shows an exemplary implementation of the pre-amplifier 1010 according to certain aspects of the present disclosure. The pre-amplifier 1010 generates the control voltages nm_a, pm_a, nm_b and pm_b for the voltage-controlled resistors 820, 830, 1020 and 1030 based on the first and second voltages $V_1$ and $V_2$. As discussed further below, the pre-amplifier 1010 has fast switching speeds allowing the pre-amplifier 1010 to change the voltages nm_a, pm_a, nm_b and pm_b rapidly in response to changes in $V_1$ and/or $V_2$ for high-speed comparison.

The pre-amplifier 1010 includes a bias inverter 1205 that is self-biased to generate a bias voltage (labeled "vabal") for the pre-amplifier 1010, as discussed further below. The inverter 1205 is self-biased by tying the input 1212 and the output 1218 of the bias inverter 1205 together, as shown in FIG. 12. The bias voltage vabal is provided at the output 1218 of the bias inverter 1205, and may be approximately equal to Vdd/2, where Vdd is the voltage at the supply rail 810.

In the example in FIG. 12, the bias inverter 1205 includes a seventh PMOS transistor 1210 and a seventh NMOS transistor 1215. The source of the seventh PMOS transistor 1210 is coupled to the supply rail 810, the drain of the seventh PMOS transistor 1210 is coupled to the output 1218 of the bias inverter 1205, and the gate of the seventh PMOS transistor 1210 is coupled to the input 1212 of the bias inverter 1205. The drain of the seventh NMOS transistor 1215 is coupled to the output 1218 of the bias inverter 1205, the gate of the seventh NMOS transistor 1215 is coupled to the input 1212 of the bias inverter 1205, and the source of the seventh NMOS transistor 1215 is coupled to ground.

The pre-amplifier 1010 also includes an eighth PMOS transistor 1220, a first resistance circuit 1240, and an eighth NMOS transistor 1225. The first resistance circuit 1240 is coupled between the drain of the eighth PMOS transistor 1220 and the drain of the eighth NMOS transistor 1225. The source of the eighth PMOS transistor 1220 is coupled to the supply rail 810, and the gate of the eighth PMOS transistor 1220 is biased by the bias voltage vabal. The source of the eighth NMOS transistor 1225 is coupled to ground, and the gate of the eighth NMOS transistor 1225 is biased by the bias voltage vabal. As discussed above, the bias voltage vabal is provided at the output 1218 of the bias inverter 1205. For ease of illustration, the connections between the output 1218 of the bias inverter 1205 and the gates of the eighth PMOS transistor 1220 and eighth NMOS transistor 1225 are not explicitly shown in FIG. 12.

As discussed above, the first resistance circuit 1240 is coupled between the drain of the eighth PMOS transistor 1220 and the drain of the eighth NMOS transistor 1225. The first resistance circuit 1240 has a resistance that is controlled by the first and second voltages $V_1$ and $V_2$. The resistance generates control voltage nm_a at node 1242 and control voltage pm_a at node 1244, where node 1242 is between the first resistance circuit 1240 and the drain of the eighth PMOS transistor 1220 and node 1244 is between the first resistance circuit 1240 and the drain of the eighth NMOS transistor 1225. The differential voltage of nm_a and pm_a may be centered at approximately vabal (e.g., Vdd/2). The control voltages nm_a and pm_a are controlled by the resistance of the first resistance circuit 1240, which, in turn, is controlled by the first and second voltages $V_1$ and $V_2$. Increasing the resistance moves control voltage nm_a up and control voltage pm_a down (i.e., increases the differential voltage of nm_a and pm_a). Decreasing the resistance moves control voltage nm_a down and control voltage pm_a up (i.e., decreases the differential voltage of nm_a and pm_a). In this example, node 1242 (which provides nm_a) is coupled to the control input 835 of the second voltage-controlled resistor 830, and node 1244 (which provides pm_a) is coupled to the control input 1025 of the third voltage-controlled resistor 1020 shown in FIG. 11.

The pre-amplifier 1010 also includes a ninth PMOS transistor 1230, a second resistance circuit 1260, and a ninth NMOS transistor 1235. The second resistance circuit 1260 is coupled between the drain of the ninth PMOS transistor 1230 and the drain of the ninth NMOS transistor 1235. The source of the ninth PMOS transistor 1230 is coupled to the supply rail 810, and the gate of the ninth PMOS transistor 1230 is biased by the bias voltage vabal. The source of the ninth NMOS transistor 1235 is coupled to ground, and the gate of the ninth NMOS transistor 1235 is biased by the bias voltage vabal. For ease of illustration, the connections between the output 1218 of the bias inverter 1205 and the gates of the ninth PMOS transistor 1230 and ninth NMOS transistor 1235 are not explicitly shown in FIG. 12.

As discussed above, the second resistance circuit 1260 is coupled between the drain of the ninth PMOS transistor 1230 and the drain of the ninth NMOS transistor 1235. The second resistance circuit 1260 has a resistance that is controlled by the first and second voltages $V_1$ and $V_2$. The resistance generates control voltage nm_b at node 1262 and control voltage pm_b at node 1264, where node 1262 is between the second resistance circuit 1260 and the drain of the ninth PMOS transistor 1230 and node 1264 is between the second resistance circuit 1260 and the drain of the ninth NMOS transistor 1235. The differential voltage of nm_b and pm_b may be centered at approximately vabal (e.g., Vdd/2). The control voltages nm_b and pm_b are controlled by the resistance of the second resistance circuit 1260, which, in turn, is controlled by the first and second voltages $V_1$ and $V_2$. Increasing the resistance moves control voltage nm_b up and control voltage pm_b down (i.e., increases the differential voltage of nm_b and pm_b). Decreasing the resistance moves control voltage nm_b down and control voltage pm_b up (i.e., decreases the differential voltage of nm_b and pm_b). In this example, node 1262 (which provides nm_b) is coupled to the control input 825 of the first voltage-controlled resistor 820, and node 1264 (which provides pm_b) is coupled to the control input 1035 of the fourth voltage-controlled resistor 1030 shown in FIG. 11.

In certain aspects, the resistance of the second resistance circuit 1260 moves in the opposite direction as the resistance of the first resistance circuit 1240 in response to changes in first voltage $V_1$ and/or the second voltage $V_2$. Accordingly, when the resistance of the first resistance circuit 1240 increases, the resistance of the second resistance circuit 1260 decreases, and vice versa.

In one example, the resistance of the first resistance circuit 1240 is greater than the resistance of the second resistance circuit 1260 when the second voltage $V_2$ is higher than the first voltage $V_1$, and the resistance of the first resistance circuit 1240 is less than the resistance of the second resistance circuit 1260 when the first voltage $V_1$ is higher than the second voltage $V_2$. When the second voltage $V_2$ is higher in this example, the differential voltage of nm_a and pm_a is greater than the differential voltage of nm_b and pm_b, where both differential voltages are centered at approximately vabal (e.g., Vdd/2). As a result, control voltage nm_a is greater than control voltage nm_b and control voltage pm_b is greater than control voltage pm_a. This causes the reference voltage Vref to be higher than the inverter threshold voltage of the second inverter 120, and the comparator 1000 to output a zero. When the first voltage $V_1$ is higher in this example, the differential voltage of nm_b and pm_b is greater than the differential voltage of nm_a and pm_a, where both differential voltages are centered at approximately vabal (e.g., Vdd/2). As a result, control voltage nm_b is greater than control voltage nm_a and control voltage pm_a is greater than control voltage pm_b. This causes the reference voltage Vref to be lower than the inverter threshold voltage of the second inverter 120, and the comparator 1000 to output a one.

In the example in FIG. 12, the first resistance circuit 1240 includes a tenth PMOS transistor 1250, an eleventh PMOS transistor 1252, a tenth NMOS transistor 1254 and an eleventh NMOS transistor 1256. The tenth PMOS transistor 1250 and the eleventh PMOS transistor 1252 are coupled in series with the source of the tenth PMOS transistor 1250 coupled to node 1242, the drain of the tenth PMOS transistor 1250 coupled to the source of the eleventh PMOS transistor 1252, and the drain of the eleventh PMOS transistor 1252 coupled to node 1244. The second voltage $V_2$ is input to the gates of the tenth and eleventh PMOS transistors 1250 and 1252.

The tenth NMOS transistor 1254 and the eleventh NMOS transistor 1256 are coupled in series with the drain of the tenth NMOS transistor 1254 coupled to node 1242, the source of the tenth NMOS transistor 1254 coupled to the drain of the eleventh NMOS transistor 1256, and the source of the eleventh NMOS transistor 1256 coupled to node 1244. The first voltage $V_1$ is input to the gates of the tenth and eleventh NMOS transistors 1254 and 1256.

The first resistance circuit 1240 has a high bandwidth, and is therefore able to response quickly to changes in the first voltage $V_1$ and/or the second voltage $V_2$. This because the source of the eleventh PMOS transistor 1252 provides a low impedance load at the drain of the tenth PMOS transistor 1250, and the source of the tenth NMOS transistor 1254 provides a low impedance load at the drain of the eleventh NMOS transistor 1256. The low load impedances increase bandwidth at the expense of lower gain. However, the inverters 110 and 120 in the next stage provide large gain, making up for the lower gain of the pre-amplifier 1010. The high bandwidth of the pre-amplifier 1010 allows the comparator 1000 to achieve high-speeds, as discussed further below.

In the example in FIG. 12, the second resistance circuit 1260 includes a twelfth PMOS transistor 1270, a thirteenth PMOS transistor 1272, a twelfth NMOS transistor 1274 and a thirteenth NMOS transistor 1276. The twelfth PMOS transistor 1270 and the thirteenth PMOS transistor 1272 are coupled in series with the source of the twelfth PMOS transistor 1270 coupled to node 1262, the drain of the twelfth PMOS transistor 1270 coupled to the source of the thirteenth PMOS transistor 1272, and the drain of the thirteenth PMOS transistor 1272 coupled to node 1264. The first voltage $V_1$ is input to the gates of the twelfth and thirteenth PMOS transistors 1270 and 1272.

The twelfth NMOS transistor 1274 and the thirteenth NMOS transistor 1276 are coupled in series with the drain of the twelfth NMOS transistor 1274 coupled to node 1262, the source of the twelfth NMOS transistor 1274 coupled to the drain of the thirteenth NMOS transistor 1276, and the source of the thirteenth NMOS transistor 1276 coupled to node 1264. The second voltage $V_2$ is input to the gates of the twelfth and thirteenth NMOS transistors 1274 and 1276.

The second resistance circuit 1260 has a high bandwidth for similar reasons as the first resistance circuit 1240 discussed above. In the example in FIG. 12, the second resistance circuit 1260 has the same structure as the first resistance circuit 1240 except that the inputs to the second resistance circuit 1260 are the reverse of the inputs to the first resistance circuit 1240. More particularly, the second voltage $V_2$ is input to the PMOS transistors 1250 and 1252 of the first resistance circuit 1240 while the second voltage $V_2$ is input to the NMOS transistors 1274 and 1276 of the second resistance circuit 1260, and the first voltage $V_1$ is input to the NMOS transistors 1254 and 1256 of the first resistance circuit 1240 while the first voltage $V_1$ is input to the PMOS transistors 1270 and 1272 of the second resistance circuit 1260. The reversed inputs cause the resistance of the first resistance circuit 1240 and the resistance of the second resistance circuit 1260 to move in opposite directions in response to changes in the first voltage $V_1$ and/or the second voltage $V_2$.

In the example in FIG. 12, the node between the tenth and eleventh NMOS transistors 1254 and 1256 is coupled to the node between the twelfth and thirteenth NMOS transistors 1274 and 1276. The node between the tenth and eleventh PMOS transistors 1250 and 1252 is coupled to the node between the twelfth and thirteenth PMOS transistors 1270 and 1272. This helps center the first and second resistance circuits 1240 and 1260.

The exemplary pre-amplifier 1010 shown in FIG. 12 allows the comparator 1000 to achieve high-speeds (e.g., propagation delay <400 ps) and high accuracy (e.g., resolution of 2 mV).

Figure 13:
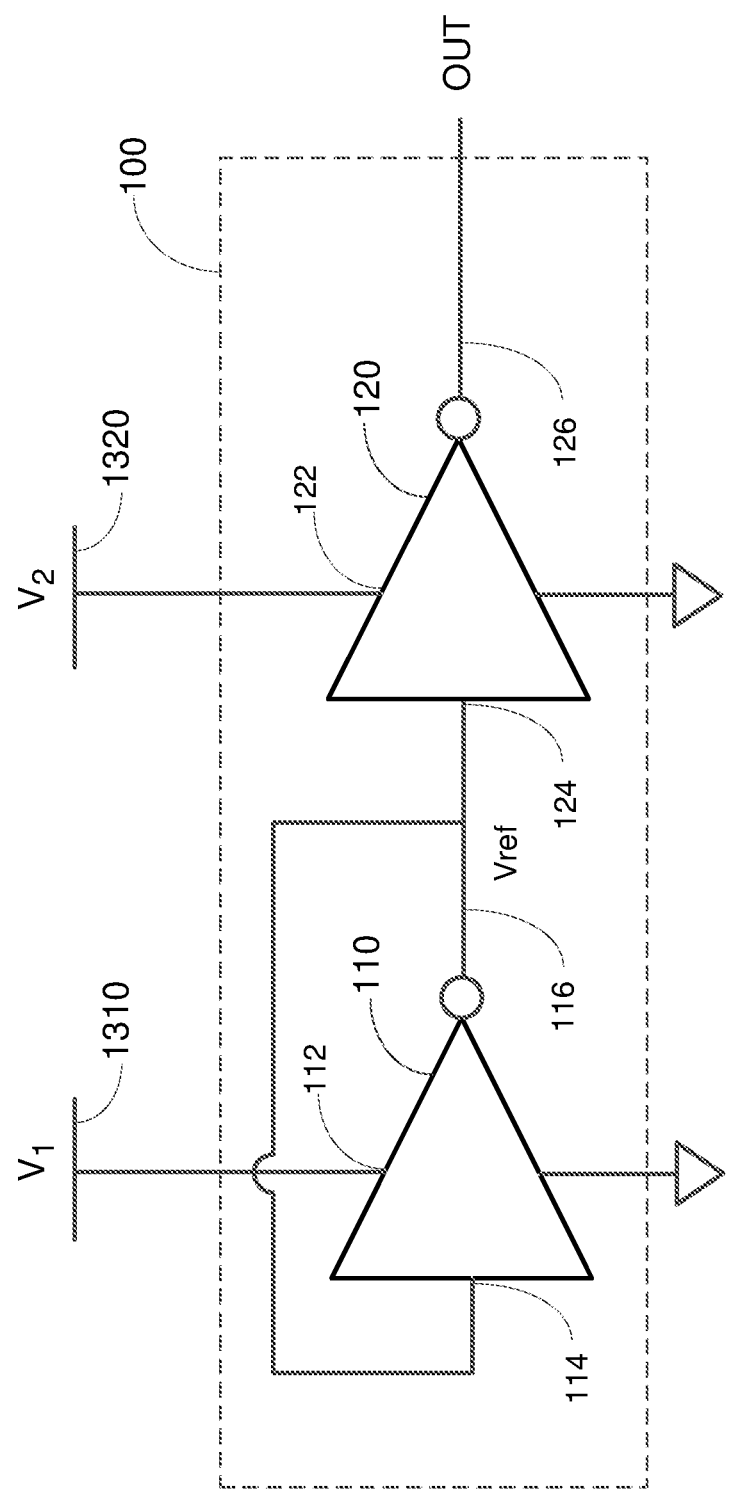
FIG. 13 shows an example in which a comparator is used to compare two supply voltages according to certain aspects of the present disclosure

As discussed above, the comparator 100 may be used to compare two supply voltages. In this regard, FIG. 13 shows an example in which the voltage supply input 112 of the first inverter 110 is coupled to a first voltage supply rail 1310, and the voltage supply input 122 of the second inverter 120 is coupled to a second voltage supply rail 1320. The first voltage supply rail 1310 provides the first voltage $V_1$, which is a first supply voltage in this example. The second voltage supply rail 1320 provides the second voltage $V_2$, which is a second supply voltage in this example.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, the term "approximately" means within 10 percent of the stated value (i.e., between 90 percent and 110 percent of the stated value).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A comparator, comprising:
   a first inverter having an input, an output, and a voltage supply input, wherein the input of the first inverter and the output of the first inverter are coupled together;
   a second inverter having an input, an output, and a voltage supply input, wherein the input of the second inverter is coupled to the output of the first inverter;
   a first voltage-controlled resistor coupled between a voltage supply rail and the voltage supply input of the first inverter; and
   a second voltage-controlled resistor coupled between the voltage supply rail and the voltage supply input of the second inverter.

2. The comparator of claim 1, wherein:
   the first voltage-controlled resistor comprises a first p-type metal oxide semiconductor (PMOS) transistor having a source, a gate, and a drain, wherein the source of the first PMOS transistor is coupled to the voltage supply rail, and the drain of the first PMOS transistor is coupled to the voltage supply input of the first inverter; and
   the second voltage-controlled resistor comprises a second PMOS transistor having a source, a gate, and a drain, wherein the source of the second PMOS transistor is coupled to the voltage supply rail, and the drain of the second PMOS transistor is coupled to the voltage supply input of the second inverter.

3. The comparator of claim 2, wherein:
   the gate of the first PMOS transistor is configured to receive a first compare voltage; and
   the gate of the second PMOS transistor is configured to receive a second compare voltage.

4. The comparator of claim 1, wherein:
   the first voltage-controlled resistor has a control input configured to receive a first compare voltage; and
   the second voltage-controlled resistor has a control input configured to receive a second compare voltage.

5. The comparator of claim 1, further comprising a pre-amplifier, wherein:
   the pre-amplifier has a first input, a second input, a first output, and a second output;
   the first input is configured to receive a first compare voltage;
   the second input is configured to receive a second compare voltage;
   the first output is coupled to a control input of the first voltage-controlled resistor;
   the second output is coupled to a control input of the second voltage-controlled resistor;
   the pre-amplifier is configured to generate a first control voltage at the first output based on the first compare voltage or both the first compare voltage and the second compare voltage; and
   the pre-amplifier is configured to generate a second control voltage at the second output based on the second compare voltage or both the second compare voltage and the first compare voltage.

6. The comparator of claim 5, wherein the pre-amplifier is configured to:
   generate the first control voltage based on a first differential of the first compare voltage and the second compare voltage; and
   generate the second control voltage based on a second differential of the first compare voltage and the second compare voltage.

7. The comparator of claim 5, wherein:
the first voltage-controlled resistor comprises a first p-type metal oxide semiconductor (PMOS) transistor having a source, a gate, and a drain, wherein the source of the first PMOS transistor is coupled to the voltage supply rail, the control input of the first voltage-controlled resistor is located at the gate of the first PMOS transistor, and the drain of the first PMOS transistor is coupled to the voltage supply input of the first inverter; and
the second voltage-controlled resistor comprises a second PMOS transistor having a source, a gate, and a drain, wherein the source of the second PMOS transistor is coupled to the voltage supply rail, the control input of the second voltage-controlled resistor is located at the gate of the second PMOS transistor, and the drain of the second PMOS transistor is coupled to the voltage supply input of the second inverter.

8. The comparator of claim 5, wherein the pre-amplifier comprises:
a first p-type metal oxide semiconductor (PMOS) transistor having a source, a gate, and a drain, wherein the source of the first PMOS transistor is coupled to the voltage supply rail, and the gate of the first PMOS transistor is biased by a bias voltage;
a first n-type metal oxide semiconductor (NMOS) transistor having a source, a gate, and a drain, wherein the source of the first NMOS transistor is coupled to a ground, and the gate of the first NMOS transistor is biased by the bias voltage; and
a first resistance circuit coupled between the drain of the first PMOS transistor and the drain of the first NMOS transistor, wherein the first resistance circuit is coupled to the first input and the second input of the pre-amplifier, a resistance of the first resistance circuit is controlled by the first compare voltage and the second compare voltage, and the first output of the pre-amplifier is coupled to a node between the drain of the first PMOS transistor and the first resistance circuit.

9. The comparator of claim 8, wherein the first resistance circuit comprises:
a second PMOS transistor having a source, a drain and a gate, wherein the source of the second PMOS transistor is coupled to the drain of the first PMOS transistor, and the gate of the second PMOS transistor is coupled to the second input of the pre-amplifier;
a third PMOS transistor having a source, a drain and a gate, wherein the source of the third PMOS transistor is coupled to the drain of the second PMOS transistor, the gate of the third PMOS transistor is coupled to the second input of the pre-amplifier, and the drain of the third PMOS transistor is coupled to the drain of the first NMOS transistor;
a second NMOS transistor having a source, a drain and a gate, wherein the drain of the second NMOS transistor is coupled to the drain of the first PMOS transistor, and the gate of the second NMOS transistor is coupled to the first input of the pre-amplifier; and
a third NMOS transistor having a source, a drain and a gate, wherein the drain of the third NMOS transistor is coupled to the source of the second NMOS transistor, the gate of the third NMOS transistor is coupled to the first input of the pre-amplifier, and the source of the third NMOS transistor is coupled to the drain of the first NMOS transistor.

10. The comparator of claim 8, wherein the pre-amplifier comprises:
a second PMOS transistor having a source, a gate, and a drain, wherein the source of the second PMOS transistor is coupled to the voltage supply rail, and the gate of the second PMOS transistor is biased by the bias voltage;
a second NMOS transistor having a source, a gate, and a drain, wherein the source of the second NMOS transistor is coupled to the ground, and the gate of the second NMOS transistor is biased by the bias voltage; and
a second resistance circuit coupled between the drain of the second PMOS transistor and the drain of the second NMOS transistor, wherein the second resistance circuit is coupled to the first input and the second input of the pre-amplifier, a resistance of the second resistance circuit is controlled by the first compare voltage and the second compare voltage, and the second output of the pre-amplifier is coupled to a node between the drain of the second PMOS transistor and the second resistance circuit.

11. The comparator of claim 10, wherein the resistance of the first resistance circuit and the resistance of the second resistance circuit are configured to move in opposite directions in response to a change in the first compare voltage, a change in the second compare voltage or changes in both the first and second compare voltages.

12. The comparator of claim 1, further comprising:
a third voltage-controlled resistor coupled between the first inverter and a ground; and
a fourth voltage-controlled resistor coupled between the second inverter and the ground.

13. The comparator of claim 12, further comprising a pre-amplifier, wherein the pre-amplifier is configured to:
receive a first compare voltage and a second compare voltage;
adjust a resistance of the first voltage-controlled resistor and a resistance of the third voltage-controlled resistor in opposite directions based on the first compare voltage or both the first compare voltage and the second compare voltage; and
adjust a resistance of the second voltage-controlled resistor and a resistance of the fourth voltage-controlled resistor in opposite directions based on the second compare voltage or both the second compare voltage and the first compare voltage.

14. The comparator of claim 12, wherein:
the first voltage-controlled resistor comprises a first p-type metal oxide semiconductor (PMOS) transistor having a source, a gate, and a drain, wherein the source of the first PMOS transistor is coupled to the voltage supply rail, and the drain of the first PMOS transistor is coupled to the voltage supply input of the first inverter; and
the second voltage-controlled resistor comprises a second PMOS transistor having a source, a gate, and a drain, wherein the source of the second PMOS transistor is coupled to the voltage supply rail, and the drain of the second PMOS transistor is coupled to the voltage supply input of the second inverter.

15. The comparator of claim 14, wherein:
the third voltage-controlled resistor comprises a first n-type metal oxide semiconductor (NMOS) transistor having a source, a gate, and a drain, wherein the drain of the first NMOS transistor is coupled to the first inverter, and the source of the first NMOS transistor is coupled to the ground; and the fourth voltage-controlled resistor comprises a second NMOS transistor having a source, a gate, and a drain, wherein the drain of the second NMOS transistor is coupled to the second inverter, and the source of the second NMOS transistor is coupled to the ground.

16. The comparator of claim 1, wherein the first inverter comprises:

a first p-type metal oxide semiconductor (PMOS) transistor having a source, a gate, and a drain, wherein the source of the first PMOS transistor is coupled to the voltage supply input of the first inverter, the drain of the first PMOS transistor is coupled to the output of the first inverter, and the gate of the first PMOS transistor is coupled to the input of the first inverter; and a first n-type metal oxide semiconductor (NMOS) transistor having a source, a gate, and a drain, wherein the drain of the first NMOS transistor is coupled to the output of the first inverter, the gate of the first NMOS transistor is coupled to the input of the first inverter, and the source of the first NMOS transistor is coupled to a ground.

17. The comparator of claim 16, wherein the second inverter comprises:

a second PMOS transistor having a source, a gate, and a drain, wherein the source of the second PMOS transistor is coupled to the voltage supply input of the second inverter, the drain of the second PMOS transistor is coupled to the output of the second inverter, and the gate of the first PMOS transistor is coupled to the input of the second inverter; and a second NMOS transistor having a source, a gate, and a drain, wherein the drain of the second NMOS transistor is coupled to the output of the second inverter, the gate of the second NMOS transistor is coupled to the input of the second inverter, and the source of the second NMOS transistor is coupled to the ground.

* * * * *